US00RE46100E

(19) United States
(12) Reissued Patent
Aburada et al.

(10) Patent Number: US RE46,100 E
(45) Date of Reissued Patent: Aug. 9, 2016

(54) METHOD OF FABRICATING SEMICONDUCTOR DEVICE AND SEMICONDUCTOR DEVICE

(71) Applicant: Kabushiki Kaisha Toshiba, Tokyo (JP)

(72) Inventors: Ryota Aburada, Kanagawa (JP); Hiromitsu Mashita, Kanagawa (JP); Toshiya Kotani, Tokyo (JP); Chikaaki Kodama, Kanagawa (JP)

(73) Assignee: KABUSHIKI KAISHA TOSHIBA, Tokyo (JP)

(21) Appl. No.: 14/284,709

(22) Filed: May 22, 2014

Related U.S. Patent Documents

Reissue of:
(64) Patent No.: 8,183,148
Issued: May 22, 2012
Appl. No.: 12/542,540
Filed: Aug. 17, 2009

(30) Foreign Application Priority Data

Aug. 18, 2008 (JP) ..... 2008-209849

(51) Int. Cl.
*H01L 21/4763* (2006.01)
*H01L 21/033* (2006.01)
*H01L 21/3213* (2006.01)

(52) U.S. Cl.
CPC ..... *H01L 21/0337* (2013.01); *H01L 21/32139* (2013.01)

(58) Field of Classification Search
CPC ..... H01L 121/3205; H01L 121/3213; H01L 121/768; H01L 123/52; H01L 123/522
See application file for complete search history.

(56) References Cited

U.S. PATENT DOCUMENTS

| | | | | |
|---|---|---|---|---|
| 5,328,810 | A * | 7/1994 | Lowrey et al. | 430/313 |
| 6,716,761 | B2 * | 4/2004 | Mitsuiki | 438/706 |
| 6,955,961 | B1 * | 10/2005 | Chung | 438/241 |
| 7,346,887 | B2 | 3/2008 | Liebmann et al. | |
| 7,671,475 | B2 | 3/2010 | Kamigaichi et al. | |
| 2006/0194429 | A1 | 8/2006 | Hashimoto et al. | |
| 2007/0290232 | A1 | 12/2007 | Nishiyama | |

FOREIGN PATENT DOCUMENTS

| | | |
|---|---|---|
| JP | 08-055908 | 2/1996 |
| JP | 2009-76902 | 4/2009 |
| JP | 2009-076902 | 4/2009 |

(Continued)

OTHER PUBLICATIONS

Notification of Reasons for Rejection issued by the Japanese Patent Office on Jan. 28, 2011, for Japanese Patent Application No. 2008-209849, and English-language translation thereof (6 pages).

*Primary Examiner* — Leonardo Andujar
(74) *Attorney, Agent, or Firm* — Finnegan, Henderson, Farabow, Garrett & Dunner, LLP

(57) ABSTRACT

A method of fabricating a semiconductor device according to an embodiment includes forming a first pattern having linear parts of a constant line width and a second pattern on a foundation layer, the second pattern including parts close to the linear parts of the first pattern and parts away from the linear parts of the first pattern and constituting closed loop shapes independently of the first pattern or in a state of being connected to the first pattern and carrying out a closed loop cut at the parts of the second pattern away from the linear parts of the first pattern.

15 Claims, 28 Drawing Sheets

(56) References Cited

FOREIGN PATENT DOCUMENTS

| | | |
|---|---|---|
| JP | 2009-260309 | 11/2009 |
| JP | 2010-045359 | 2/2010 |
| JP | 2010-45359 | 2/2010 |
| WO | WO 2008/027239 A2 | 3/2008 |

* cited by examiner

METHOD OF FABRICATING SEMICONDUCTOR DEVICE AND SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This [application] *is a reissue of U.S. Pat. No. 8,183,148, issued on May 22, 2012 from U.S. patent application Ser. No. 12/542,540 filed Aug. 17, 2009, which* is based upon and claims the benefit of priority from prior Japanese Patent Application No. 2008-209849, filed on Aug. 18, 2008, the entire contents of *both of* which are incorporated herein by reference.

BACKGROUND

Recently, in accordance with miniaturization of a semiconductor element, a method capable of forming a pattern having a dimension beyond a resolution limit in lithography method is required.

As one sample of the method, a method is known, that includes steps of forming sidewall patterns on side surfaces of core materials, eliminating the core materials, and etching a workpiece film by using the sidewall patterns as a mask, for example, disclosed in JP-A-1996-55908.

Since the sidewall patterns and wiring patterns formed by using the sidewall patterns as a mask have closed loop shapes, a step of a closed loop cut for cutting a part of the closed loop shape is needed. In case that the other patterns exist close to the sites where the closed loop cut is carried out, generally, spaces are created between the other patterns in terms of a margin of displacement at the alignment in the lithography method.

BRIEF SUMMARY

A method of fabricating a semiconductor device according to an embodiment includes forming a first pattern having linear parts of a constant line width and a second pattern on a foundation layer, the second pattern including parts close to the linear parts of the first pattern and parts away from the linear parts of the first pattern and constituting closed loop shapes independently of the first pattern or in a state of being connected to the first pattern and carrying out a closed loop cut at the parts of the second pattern away from the linear parts of the first pattern.

A method of fabricating a semiconductor device according to another embodiment includes forming a first pattern having linear parts of a constant line width and a second pattern having parts parallel to the first pattern which have a first distance between the linear parts of the first pattern, and constituting closed loop shapes independently of the first pattern or in a state of being connected to the first pattern and forming a resist in the parts of the second pattern so as to have a second distance between the linear parts of the first pattern larger than the first distance, and carrying out a closed loop cut at the parts of the second pattern in which the resist is formed.

A method of fabricating a semiconductor device according to another embodiment includes forming a first pattern group including a plurality of first patterns arranged at a predetermined pitch, and second pattern group including a plurality of second patterns arranged at the predetermined pitch, the closest second patterns to at least the first pattern group of the plural second patterns having parallel parts parallel to the first pattern group and parts away from the second pattern group and constituting closed loop shapes independently of the first pattern group or in a state of being connected to the first pattern group and carrying out a closed loop cut at the parts of the second pattern away from the first pattern group.

A semiconductor device according to another embodiment includes a first pattern group including a plurality of first patterns arranged at a predetermined pitch and a second pattern group including a plurality of second patterns arranged at the predetermined pitch, wherein the closest second patterns to at least the first pattern group of the plural second patterns have parallel parts parallel to the first pattern group and non-parallel parts formed so as to be connected to the parallel parts, to be away from the first pattern group and to be not parallel to the first pattern group.

BRIEF DESCRIPTION OF THE DRAWING

FIGS. 23A to 24C are main part plan views schematically showing each of upper wiring layers used in an example of a fabrication process according to a twentieth embodiment;

FIGS. 24A to 24C are main part plan views schematically showing each of upper wiring layers used in an example of a fabrication process according to a twenty-first embodiment.

DETAILED DESCRIPTION

A method of fabricating a semiconductor device according to the embodiment includes forming a first pattern having linear parts of a constant line width and a second pattern on a foundation layer, the second pattern including parts close to the linear parts of the first pattern and parts away from the linear parts of the first pattern and constituting closed loop shapes independently of the first pattern or in a state of being connected to the first pattern and carrying out a closed loop cut at the parts of the second pattern away from the linear parts of the first pattern.

As the foundation layer, a substrate such as a silicon substrate or a workpiece film to be processed by using the first and second patterns as a mask can be used. Further, the workpiece film can be formed between the foundation layer and the first and second patterns.

As the first and second patterns, a bit-line and a word line constituting a memory device, a wiring by a line and space, or a pattern used as a mask can be used.

As the first pattern, for example, a pattern having a closed loop shape or a line pattern can be used. Further, the first pattern can include a part having a line width wider than that of the linear part of the constant line width.

The part of the second pattern close to the linear part of the first pattern is, for example, a parallel part close to and parallel to the linear part of the first pattern. The parallel part of the second pattern can have a linear shape or a carved shape, if it is parallel to the linear part of the first pattern.

(First Embodiment)

FIGS. 1A to 1H are cross-sectional views schematically showing each feature in a fabrication process of a semiconductor device according to the first embodiment. FIGS. 2A to 2C are plan views schematically showing processes of a closed loop cut carried out between the process shown in FIG. 1D and the process shown in FIG. 1E.

Figure 1A:
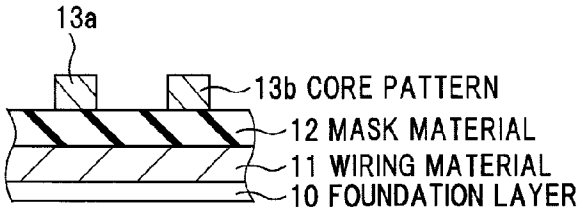
FIGS. 1A to 1H are cross-sectional views schematically showing each feature in a fabrication process of a semiconductor device according to a first embodiment.
Figure 2A:
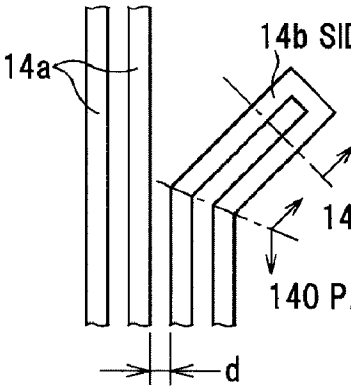
FIGS. 2A to 2C are plan views schematically showing processes of a closed loop cut carried out between the process shown in FIG. 1D and the process shown in FIG. 1E.
Figure 2B:
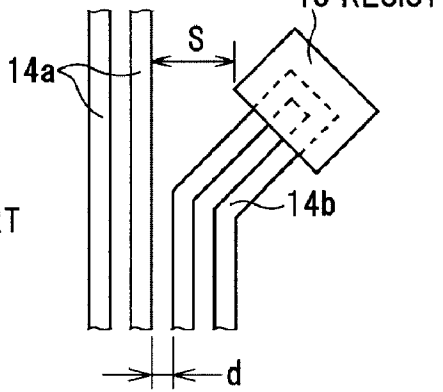
Figure 2C:
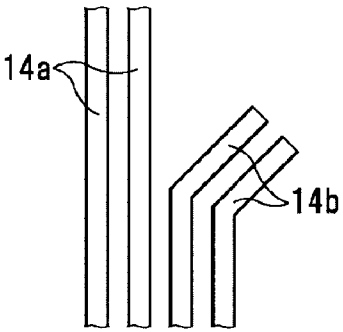

As shown in FIG. 1A, a wiring material (a workpiece film) 11 for forming a wiring layer via a foundation layer 10 is formed on a semiconductor substrate such as a silicon substrate, a mask material 12 is formed on the wiring material 11 and core patterns 13a, 13b are formed on the mask material 12 by a lithography method and an etching process which use a resist. The core patterns 13a, 13b have, for example, a line width (for example, 40 nm) near the resolution limit "W" of lithography method.

As the wiring material 11, for example, Cu, W, Al or the like can be used. As the mask material 12, for example, silicon oxide film or the like can be used. As the core patterns 13a, 13b, for example, amorphous silicon film or the like can be used.

Figure 1B:
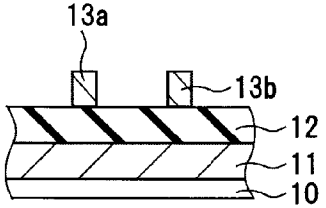

Next, as shown in FIG. 1B, a slimming treatment is carried out so as to make the width of the core patterns 13a, 13b thin up to a half size by an anisotropic etching or the like. By this, the core patterns 13a, 13b having a line width (for example, 20 nm) of almost a half size of the resolution limit "W" can be obtained.

Figure 1C:
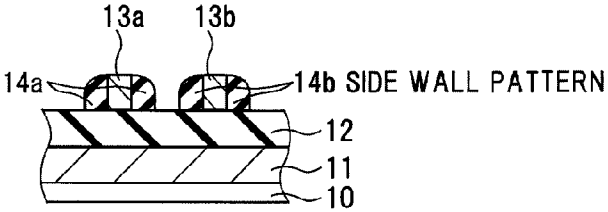

Next, as shown in FIG. 1C, a film to become a material of side wall patterns is deposited on the whole surfaces including the side surfaces of the core patterns 13a, 13b after the slimming treatment, parts of the film which are deposited on the upper surfaces of the core patterns 13a, 13b and the surface of the mask material 12 are eliminated by using the anisotropic etching or the like so as to form side wall patterns 14a, 14b on the side surfaces of the core patterns 13a, 13b. The side wall patterns 14a, 14b has, for example, a line width and an distance of almost a half size of the resolution limit "W".

The side wall patterns 14a, 14b are formed of a material having a high etching selectivity to the core patterns 13a, 13b, for example, if the core patterns 13a, 13b are formed of the amorphous silicon film, silicon nitride film or the like can be used as the material.

Figure 1D:
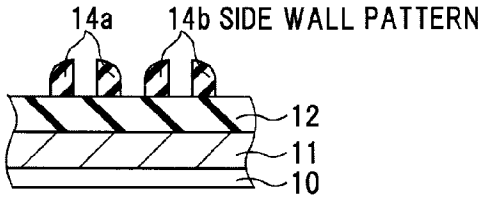

Next, as shown in FIG. 1D, the core patterns 13a, 13b are eliminated by a dry etching such as a chemical dry etching (CDE), a reactive ion etching (RIE) or the like so as to leave the side wall patterns 14a, 14b having a high etching selectivity to the core patterns 13a, 13b. At this time, each of the both end portions of the side wall patterns 14a, 14b forms a closed loop shape.

In FIG. 2A, the side wall patterns 14b show an object pattern (the second pattern) which is an object of the closed loop cut, and the side wall patterns 14a show an adjacency pattern (the first pattern) adjacent to the side wall patterns 14b. In case of the embodiment, the side wall patterns 14a, 14b include linear parts of a constant line width. Further, the adjacency pattern can be an object of the closed loop cut. In order to carry out the closed loop cut of the side wall patterns 14b, in terms of a margin of displacement at the alignment in the lithography method, it is needed for a region of the side wall patterns 14b where the closed loop cut is carried out to be away from the side wall patterns 14a so that the resist 15 does not fall over the side wall patterns 14a. Therefore, the side wall patterns 14b are formed so as to have the following shape.

Namely, the side wall patterns 14b are close to the side wall patterns 14a so as to have a distance "d" (a first distance) between the side wall patterns 14a, and has parallel parts 140 parallel to the side wall patterns 14a and nonparallel parts 141 formed so as to be connected to the parallel parts 140 and to be not parallel to the side wall patterns 14a, and cut regions 141a where the closed loop cut is carried out is formed in the nonparallel parts 141. The nonparallel parts 141 are formed in a shape bent in an oblique direction from the joining point of the parallel part 140 and the nonparallel part 141 so as to be apart from the side wall patterns 14a, but it can have a shape bent in a rectangular direction.

As shown in FIG. 2B, a space "S" (a second distance) is formed on the cut region 141a located at the end portions of the side wall patterns 14b, between the side wall patterns 14a and a resist 15 is formed, and as shown in FIG. 2C, the cut region 141a of the side wall patterns 14b is cut by the lithography method. The space "S" is formed so as to be larger than the distance "d" (the first distance) between the side wall patterns 14a and the side wall patterns 14b.

Figure 1E:
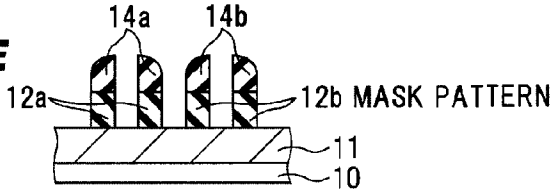
Figure 1F:
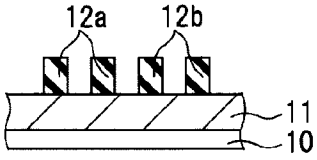

Next, as shown in FIG. 1E, the mask material 12 is eliminated by using the side wall patterns 14a, 14b as a mask and by a dry etching or the like where a gas such as $CF_4$, $CHF_3$ is used so as to form mask patterns 12a, 12b, and as shown in FIG. 1F, the side wall patterns 14a, 14b are eliminated by a wet etching or the like.

Figure 1G:
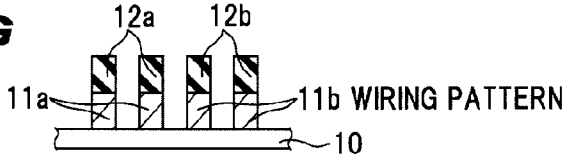
Figure 1H:
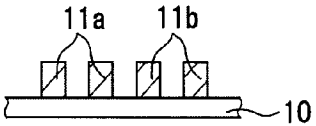

Next, as shown in FIG. 1G, the wiring material 11 is etched by using the mask patterns 12a, 12b so as to form wiring patterns 11a, 11b, and as shown in FIG. 1H, the mask patterns 12a, 12b are eliminated by the wet etching or the like.

According to the first embodiment, even if the side wall patterns have an arrangement pitch less than the resolution limit "W" in lithography method, the closed loop cut of the side wall patterns can be carried out.

(Second Embodiment)

Figure 3A:
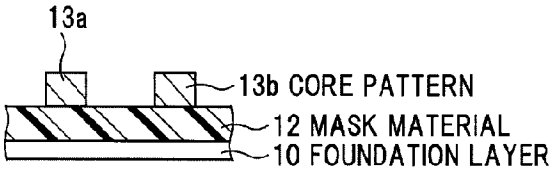
FIGS. 3A to 3H are cross-sectional views schematically showing each feature in a fabrication process of a semiconductor device according to a second embodiment.
Figure 3B:
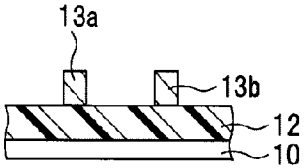
Figure 3C:
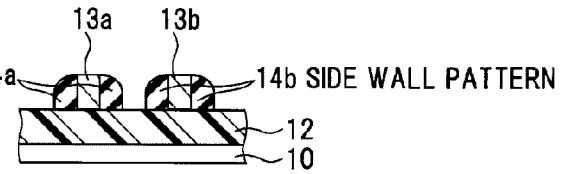
Figure 3D:
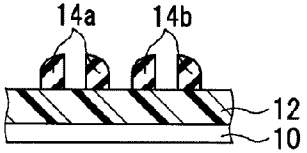
Figure 3E:
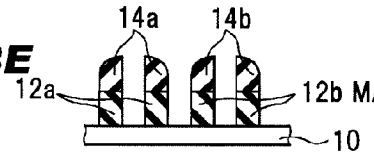
Figure 3F:
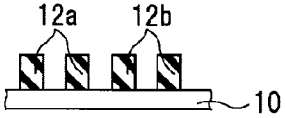
Figure 3G:
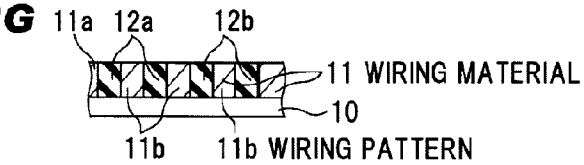
Figure 3H:
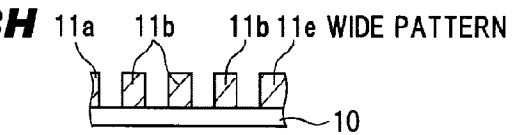
Figure 4A:
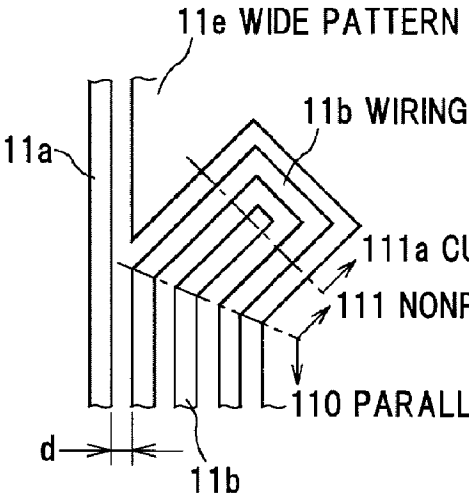
FIGS. 4A to 4C are plan views schematically showing processes of a closed loop cut carried out after the process shown in FIG. 3H.
Figure 4B:
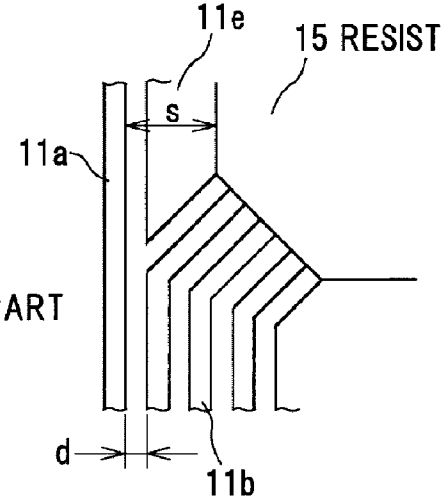
Figure 4C:
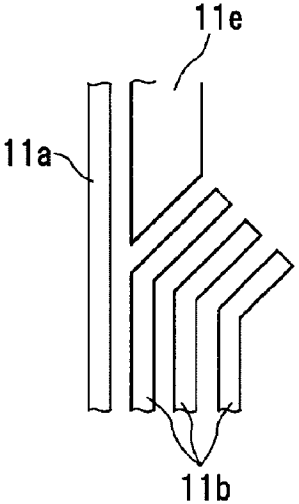

FIGS. 3A to 3H are cross-sectional views schematically showing each feature in a fabrication process of a semiconductor device according to the second embodiment and FIGS. 4A to 4C are plan views schematically showing processes of a closed loop cut carried out after the process shown in FIG. 3H. In the first embodiment, the wiring material is preliminarily formed, the closed loop cut of the end portions of the side wall patterns are carried out, and then the wiring pattern is formed from the wiring material, but in the second embodiment, the wiring pattern having a closed loop shape is formed, and then the closed loop cut of the end portions of the side wall patterns is carried out.

As shown in FIG. 3A, the mask material 12 is formed on a semiconductor substrate such as a silicon substrate via the foundation layer 10, and the core patterns 13a, 13b are formed on the mask material 12 by a lithography method and an etching process which use a resist. The core patterns 13a, 13b have, for example, a line width (for example, 40 nm) near the resolution limit "W" of lithography method.

As the mask material 12, for example, silicon oxide film or the like can be used. As the core patterns 13a, 13b, for example, amorphous silicon film or the like can be used.

Next, as shown in FIG. 3B, a slimming treatment is carried out so as to make the width of the core patterns 13a, 13b thin up to a half size by an anisotropic etching or the like. By this, the core patterns 13a, 13b having a line width (for example, 20 nm) of almost a half size of the resolution limit "W" can be obtained.

Next, as shown in FIG. 3C, a film to become a material of side wall patterns is deposited on the whole surfaces including the side surfaces of the core patterns 13a, 13b after the slimming treatment, parts of the film which are deposited on the upper surfaces of the core patterns 13a, 13b and the surface of the mask material 12 are eliminated by using the anisotropic etching or the like so as to form side wall patterns 14a, 14b on the side surfaces of the core patterns 13a, 13b. The side wall patterns 14a, 14b has, for example, a line width and an distance of almost a half size of the resolution limit "W".

Next, as shown in FIG. 3D, the core patterns 13a, 13b are eliminated by a dry etching such as CDE, RIE or the like so as to leave the side wall patterns 14a, 14b having a high etching selectivity to the core patterns 13a, 13b. Each of the both end portions of the side wall patterns 14a, 14b forms a closed loop shape similarly to the first embodiment.

Next, as shown in FIG. 3E, the mask material 12 is eliminated by using the side wall patterns 14a, 14b as a mask and by a dry etching or the like where a gas such as $CF_4$, $CHF_3$ is used so as to form mask patterns 12a, 12b, and as shown in FIG. 3F, the side wall patterns 14a, 14b are eliminated by a wet etching or the like.

Next, as shown in FIG. 3G, the wiring material 11 is formed on the whole surfaces including grooves between the mask patterns 12a, 12b by a sputtering method, a plating method or the like, and then the wiring material 11 located outside the grooves is eliminated by a chemical mechanical polishing (CMP) so as to fill the wiring material 11 in the grooves between the mask patterns 12a, 12b. As the wiring material 11, for example, Cu, W, Al or the like can be used.

Next, as shown in FIG. 3H, the mask patterns 12a, 12b are eliminated so as to form the wiring patterns 11a, 11b and wide patterns 11e having a width wider than that of the wiring patterns 11a, 11b. Both of the end portions of the wiring patterns 11a, 11b are formed in a closed loop shape.

In FIG. 4A, the wiring pattern 11b shows an object pattern (the second pattern) which is an object of the closed loop cut, and the wiring pattern 11a shows an adjacency pattern (the first pattern) adjacent to the wiring pattern 11b. In case of the embodiment, the wiring patterns 11a, 11b include linear parts of a constant line width. Further, the adjacency pattern can be an object of the closed loop cut. In order to carry out the closed loop cut of the wiring pattern 11b, in terms of a margin of displacement at the alignment in the lithography method, it is needed for a region of the wiring pattern 11b where the closed loop cut is carried out to be away from the wiring pattern 11a so that the resist 15 does not fall over the wiring pattern 11a. Therefore, the wiring pattern 11b is formed so as to have the following shape.

Namely, the wiring pattern 11b has parallel parts 110 parallel to the wiring pattern 11a and nonparallel parts 111 formed so as to be connected to the parallel parts 110 and to be not parallel to the wiring pattern 11a, and cut regions 111a where the closed loop cut is carried out is formed in the nonparallel parts 111. The nonparallel parts 111 are formed in a shape bent in an oblique direction from the joining point of the parallel part 110 and the nonparallel part 111 so as to be apart from the wiring pattern 11a, but it can have a shape bent in a rectangular direction.

As shown in FIG. 4B, a space "S" (the second distance) is formed on the cut region 111a located at the end portion of the wiring pattern 11b, between the wiring pattern 11a and a resist 15 is formed, and as shown in FIG. 4C, the cut region 111a of the wiring pattern 11b is cut by the lithography method. The space "S" is formed so as to be larger than the distance "d" (the first distance) between the wiring pattern 11a and the wiring pattern 11b.

According to the second embodiment, even if the wiring pattern has an arrangement pitch less than the resolution limit "W" in lithography method, the closed loop cut of the wiring pattern can be carried out. The side wall patterns 14b as the second pattern are close to the side wall patterns 14a so as to have a distance "d" (a first distance) between the side wall patterns 14a, and has parallel parts 140 parallel to the side wall patterns 14a and nonparallel parts 141 formed so as to be connected to the parallel parts 140 and to be not parallel to the side wall patterns 14a, and cut regions 141a where the closed loop cut is carried out is formed in the nonparallel parts 141.

(Third Embodiment)

Figure 5A:
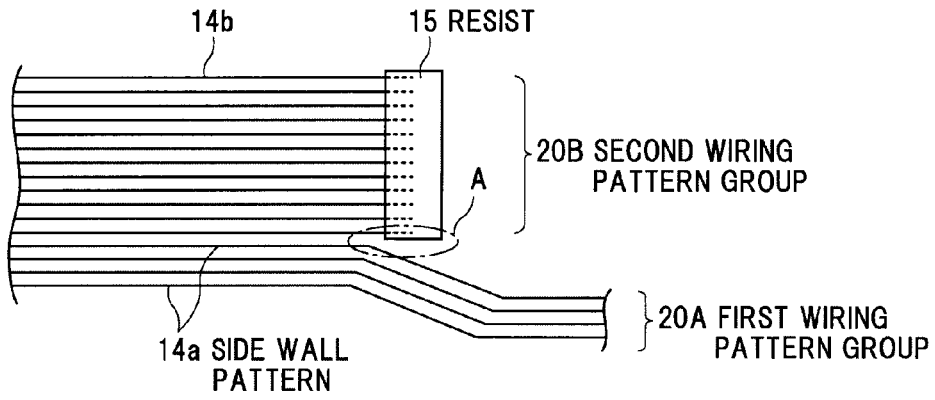
FIG. 5A is a plan view schematically showing an example of side wall patterns used in a third embodiment.
Figure 5B:
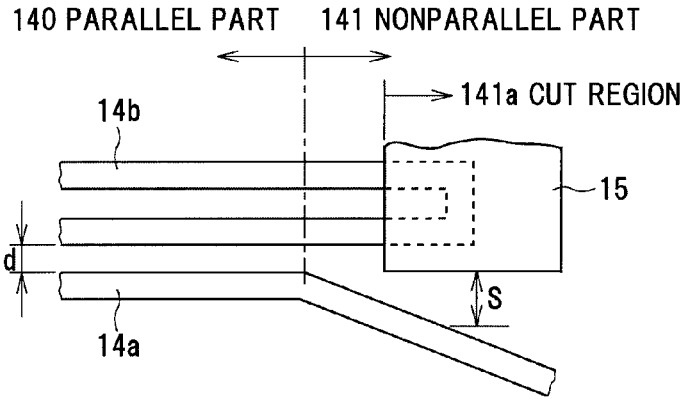
FIG. 5B is a detail view of an "A" part of the side wall patterns shown in FIG. 5A.

FIG. 5A is a plan view schematically showing an example of side wall patterns used in a third embodiment and FIG. 5B is a detail view of an "A" part of the side wall patterns shown in FIG. 5A. In the first embodiment, the side wall patterns 14a as the first pattern have a linear shape and the side wall patterns 14b as the second pattern have a nonlinear and bent shape, but in the third embodiment, the side wall patterns 14a as the first pattern have a bent shape, and the side wall patterns 14b as the second pattern have a linear shape and have the cut regions 141a in the end portions where the closed loop cut is carried out.

According to the third embodiment, similarly to the first embodiment, even if the side wall patterns have an arrangement pitch less than the resolution limit "W" in lithography method, the closed loop cut of the side wall patterns can be carried out.

Next, the fourth to the eighth embodiments where the semiconductor device of the first embodiment is applied to a phase-change memory will be explained. The fourth to the eighth embodiments show a case that the wiring patterns 11a, 11b constituting each of wiring pattern groups 20A, 20B include thirty-six (36) lines of 20 nm in line width respectively.

(Fourth Embodiment)

Figure 6A:
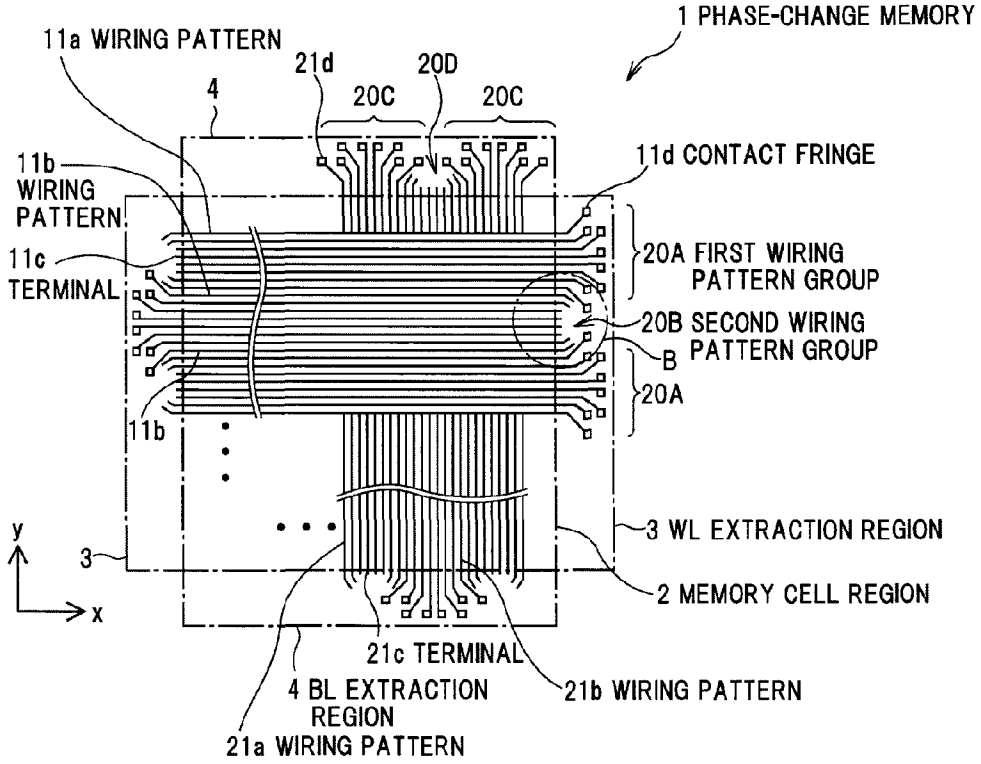
FIG. 6A is a plan view schematically showing a structure of a wiring pattern in a wiring layer of a phase-change memory used in a fourth embodiment.
Figure 6B:
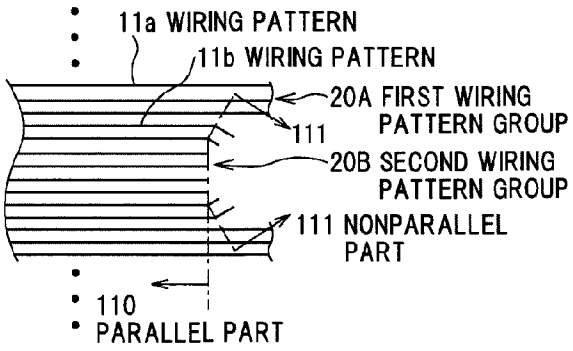
FIG. 6B is a detail view of a "B" part of the side wall patterns shown in FIG. 6A.

FIG. 6A is a plan view schematically showing a structure of a wiring pattern in a wiring layer of a phase-change memory used in a fourth embodiment and FIG. 6B is a detail view of a "B" part of the side wall patterns shown in FIG. 6A.

As shown in FIG. 6A, the phase-change memory 1 includes a memory cell region 2, a WL extraction region 3 where word lines (WL) are extracted, formed on the right and left sides of memory cell region 2, a BL extraction region 4 where bit lines (BL) are extracted, formed on the top and bottom sides of memory cell region 2, and a peripheral circuit disposed under the memory cell region 2.

The phase-change memory 1 includes a plurality of bit lines formed of the wiring patterns 11a, 11b extending in an "x" direction, a plurality of word lines formed of the wiring patterns 21a, 21b extending in an "y" direction, and a plurality of memory cells disposed in each of crossing parts of the bit lines and the word lines. The memory cell includes a series circuit having a variable resistive element formed of chalcogenide or the like and a diode such as a Schottky diode. In the phase-change memory 1, signal lines for sell selection can be omitted so that high cell-integration can be achieved.

A three dimensional memory structure can be configured by that a cell array is configured so as to include a lower wiring layer where a plurality of word lines are formed, a memory layer having a plurality of memory cells and formed on the lower wiring layer, and an upper wiring layer formed on the memory cells, where a plurality of bit lines are formed, and a plurality of the cell arrays are disposed on a silicon substrate in a stacked state.

As shown in FIG. 6A, the bit lines constituting the upper wiring layer include a first wiring pattern group 20A formed at a location totally shifted in the right side and including the wiring pattern 11a (the first pattern) of a predetermined lines, and a second wiring pattern group 20B formed at a location totally shifted in the left side and including the wiring pattern 11b (the second pattern) of a predetermined lines.

As shown in FIG. 6A, the word lines constituting the lower wiring layer include a first wiring pattern group 20C formed at a location totally shifted in the top side and including the wiring pattern 21a (the first pattern) of a predetermined lines, and a second wiring pattern group 20D formed at a location totally shifted in the bottom side and including the wiring pattern 21b (the second pattern) of a predetermined lines.

The wiring patterns 11a, 11b include terminals 11c to which the closed loop cut is carried out in one end portion, and contact fringes 11d formed in another end portion by that the closed loop cut is carried out after a treatment of leaving the core materials is conducted. The terminals 11c and the contact fringes 11d are formed in the WL extraction region 3. The wiring patterns 21a, 21b include terminals 21c to which the closed loop cut is carried out in one end portion, and contact fringes 21d formed in another end portion by that the closed loop cut is carried out after a treatment of leaving the core materials is conducted. The terminals 21c and the contact fringes 21d are formed in the BL extraction region 4.

As shown in FIG. 6B, in the wiring pattern 11b constituting the second wiring pattern group 20B of the upper wiring layer, a plurality of wiring patterns 11b adjacent to the first wiring pattern group 20A include a parallel part 110 and a nonparallel part 111, and a plurality of wiring patterns 11b located at a center portion do not have the nonparallel part 111. The first wiring pattern group 20A has also the same structure, and the first and second wiring pattern groups 20C, 20D on the lower wiring layer have also the same structure.

FIGS. 7A to 7F are main part plan views schematically showing each of upper wiring layers used in an example of a fabrication process according to the fourth embodiment. FIGS. 7A to 7D correspond to FIGS. 1A to 1D respectively, FIG. 7E corresponds to FIG. 2B and FIG. 7F corresponds to FIG. 1H.

Figure 7A:
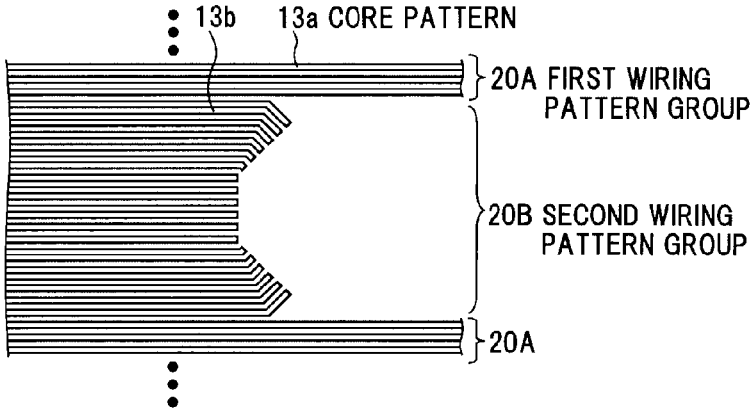
FIGS. 7A to 7F are main part plan views schematically showing each of upper wiring layers used in an example of a fabrication process according to a fourth embodiment.

Similarly to the first embodiment, after the wiring material and the mask material are formed on the foundation layer, as shown in FIG. 7A, the core patterns 13a, 13b are formed on the mask material. A plurality of core patterns 13b of the second wiring pattern group 20B adjacent to the first wiring pattern group 20A are bent in the end portions thereof in an oblique direction so as to be apart from the first wiring pattern group 20A.

Figure 7B:
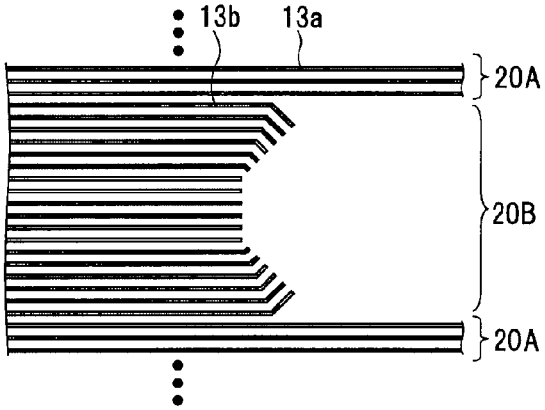
Figure 7C:
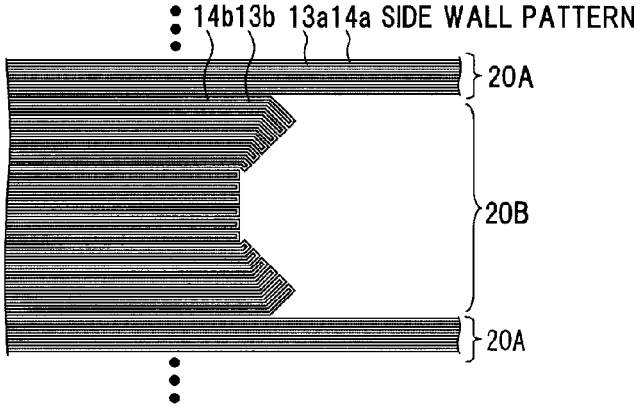
Figure 7D:
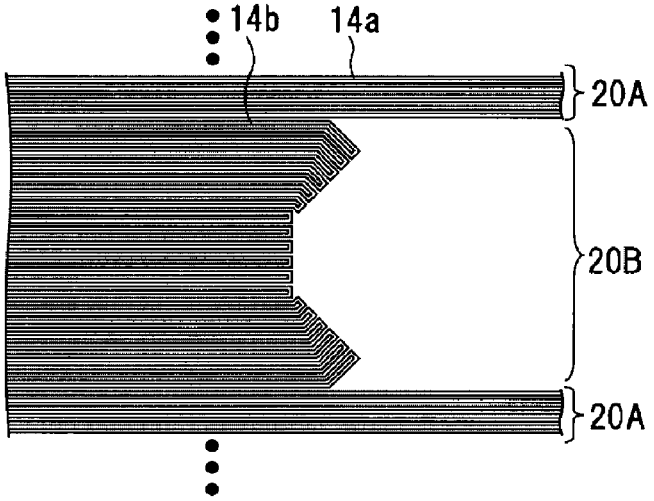

Next, as shown in FIG. 7B, a slimming treatment of the core patterns 13a, 13b is carried out, and as shown in FIG. 7C, the side wall patterns 14a, 14b are formed on the side surfaces of core patterns 13a, 13b after the slimming treatment, and as shown in FIG. 7D, the core patterns 13a, 13b are eliminated by an etching so as to leave the side wall patterns 14a, 14b.

Figure 7E:
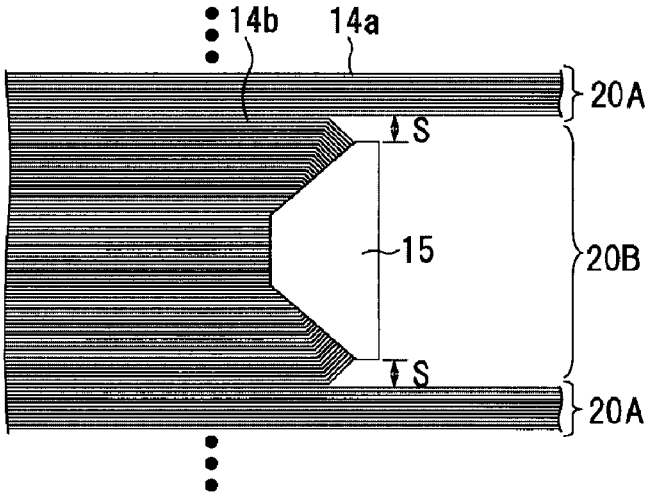

As shown in FIG. 7E, a space "S" is formed on the cut region located at the end portion of the side wall patterns 14b, between the first wiring pattern group 20A, and the resist 15 having a hexagonal shape is formed, and the cut regions of the side wall patterns 14b are cut by the lithography method. The space "S" between the first wiring pattern group 20A and the resist 15 is, for example, set to 140 nm, in terms of a margin of displacement at the alignment in the lithography method.

Figure 7F:
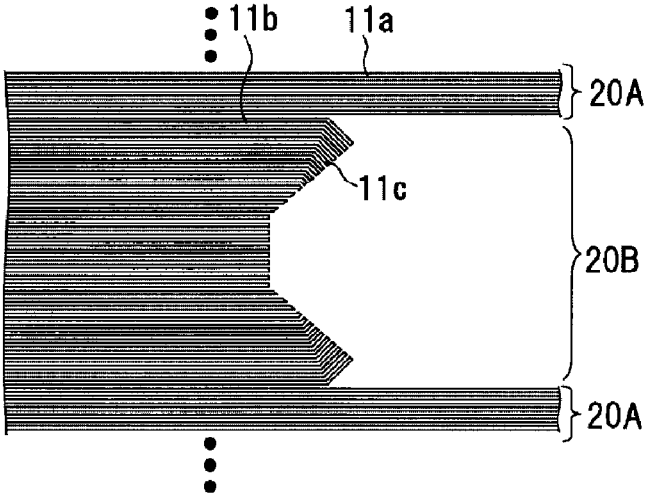

Next, the mask material is eliminated by using the side wall patterns 14a, 14b as a mask and by an etching so as to form mask patterns, and the side wall patterns 14a, 14b are eliminated. Next, the wiring material is etched by using the mask patterns so as to form wiring patterns 11a, 11b, and the mask patterns are eliminated. As shown in FIG. 7F, the wiring patterns 11a, 11b having a line width and distance of 20 nm are obtained.

According to the fourth embodiment, even if the side wall patterns have an arrangement pitch less than the resolution limit "W" in lithography method, the closed loop cut of the side wall patterns can be carried out. Further, the first and second wiring pattern groups are alternately shifted in the right and left sides, and the top and bottom sides so that the areas of the extraction regions 3, 4 can be reduced, and high cell-integration of the phase-change memory can be achieved.

(Fifth Embodiment)

Figure 8A:
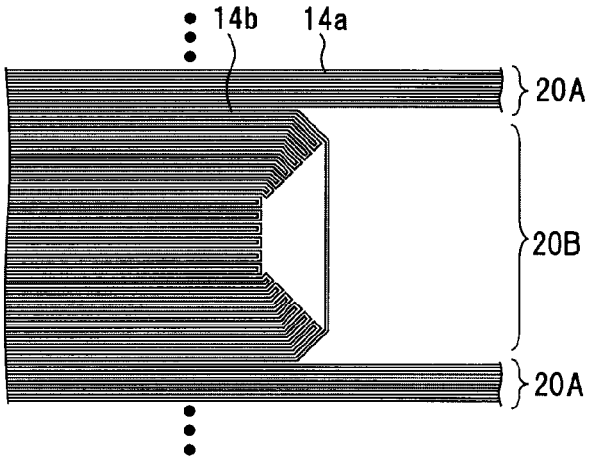
FIGS. 8A to 8C are main part plan views schematically showing each of upper wiring layers used in an example of a fabrication process according to a fifth embodiment.
Figure 8B:
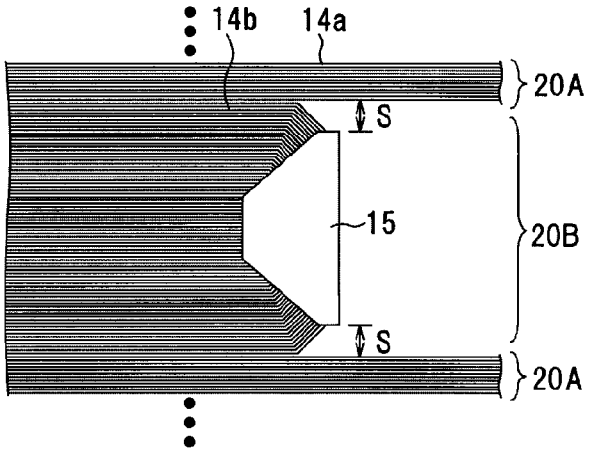
Figure 8C:
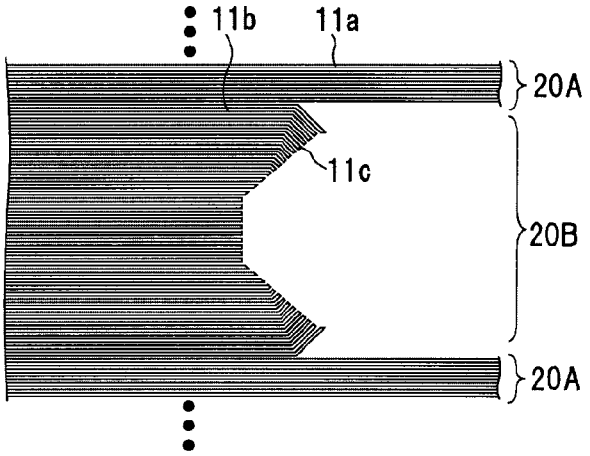

FIGS. 8A to 8C are main part plan views schematically showing each of upper wiring layers used in an example of a fabrication process according to the fifth embodiment. FIG. 8A corresponds to FIG. 1D, FIG. 8B corresponds to FIG. 2B, and FIG. 8C corresponds to FIG. 1H. Further, drawings corresponding to FIGS. 1A to 1C are omitted.

As shown in FIG. 8A, in the side wall patterns 14b constituting the second wiring pattern group 20B of the fifth embodiment, the side wall patterns 14b closest to the first wiring pattern groups 20A are connected each other so as to form a closed loop shape and the other thirty-four (34) lines of the side wall patterns 14b form the closed loop shapes between the side wall patterns 14b adjacent to each other.

After that, as shown in FIG. 8B, a space "S" is formed on the cut region located at the end portions of the side wall patterns 14b, between the first wiring pattern group 20A, the resist 15 having a hexagonal shape is formed, the cut region of the side wall patterns 14b is cut by the lithography method, and as shown in FIG. 8C, the wiring patterns 11a, 11b similar to those of the fourth embodiment are formed.

(Sixth Embodiment)

Figure 9A:
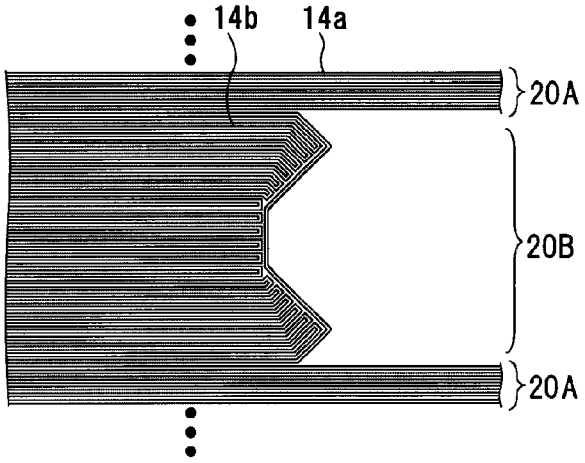
FIGS. 9A to 9C are main part plan views schematically showing each main part of upper wiring layers used in an example of a fabrication process according to a sixth embodiment.
Figure 9B:
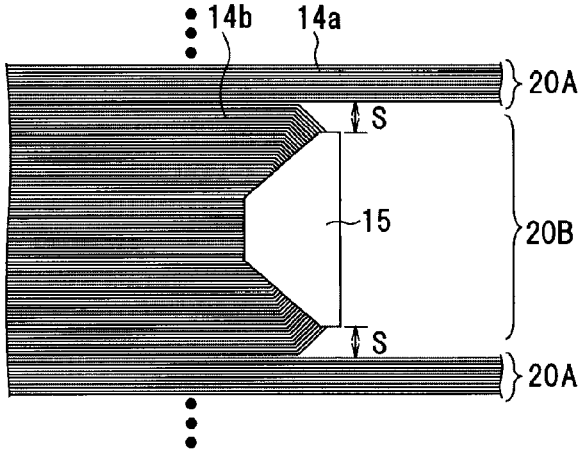
Figure 9C:
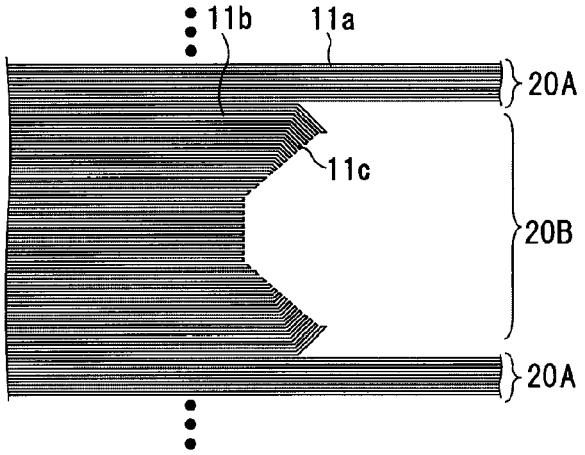

FIGS. 9A to 9C are main part plan views schematically showing each main part of upper wiring layers used in an example of a fabrication process according to the sixth embodiment. FIG. 9A corresponds to FIG. 1D, FIG. 9B corresponds to FIG. 2B, and FIG. 9C corresponds to FIG. 1H. Further, drawings corresponding to FIGS. 1A to 1C are omitted.

As shown in FIG. 9A, in the side wall patterns 14b constituting the second wiring pattern group 20B of the sixth embodiment, the side wall patterns 14b closest to the first wiring pattern groups 20A are connected each other along the end portions of the other side wall patterns 14b so as to form a closed loop shape and the other thirty-four (34) lines of the side wall patterns 14b form the closed loop shapes between the side wall patterns 14b adjacent to each other.

After that, as shown in FIG. 9B, a space "S" is formed on the cut region located at the end portions of the side wall patterns 14b, between the first wiring pattern group 20A, the resist 15 having a hexagonal shape is formed, the cut region of the side wall patterns 14b is cut by the lithography method, and as shown in FIG. 9C, the wiring patterns 11a, 11b similar to those of the fourth embodiment are formed.

(Seventh Embodiment)

Figure 10A:
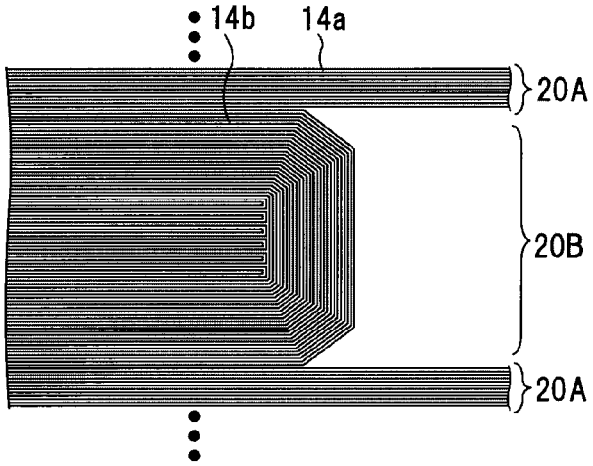
FIGS. 10A to 10C are main part plan views schematically showing each of upper wiring layers used in an example of a fabrication process according to a seventh embodiment.
Figure 10B:
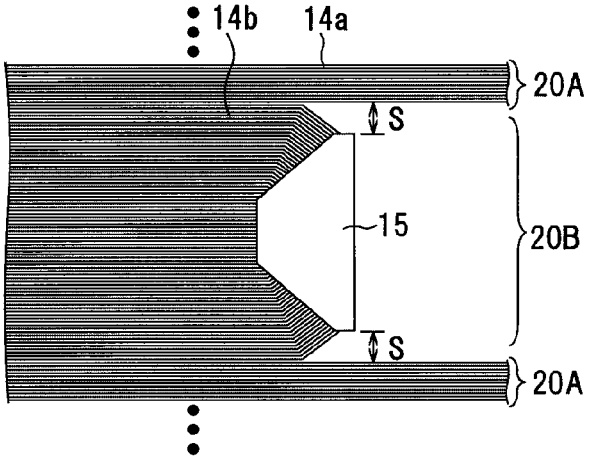
Figure 10C:
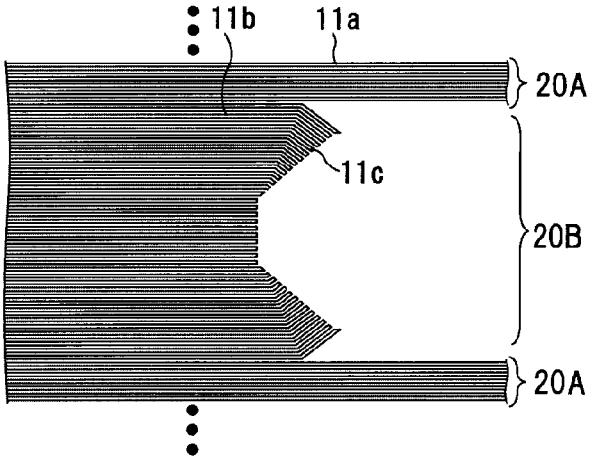

FIGS. 10A to 10C are main part plan views schematically showing each of upper wiring layers used in an example of a fabrication process according to a seventh embodiment. FIG. 10A corresponds to FIG. 1D, FIG. 10B corresponds to FIG. 2B, and FIG. 10C corresponds to FIG. 1H. Further, drawings corresponding to FIGS. 1A to 1C are omitted.

As shown in FIG. 10A, in the side wall patterns 14b constituting the second wiring pattern group 20B of the seventh embodiment, twenty-six (26) lines of the side wall patterns 14b located at the side close to the first wiring pattern group 20A are connected each other so as to form a closed loop shape between two side wall patterns 14b, starting from the two side wall patterns 14b closest to the first wiring pattern groups 20A. Further, the ten (10) lines of the side wall patterns 14b located interiorly form the closed loop shapes between the side wall patterns 14b adjacent to each other.

After that, as shown in FIG. 10B, a space "S" is formed on the cut region located at the end portion of the side wall patterns 14b, between the first wiring pattern group 20A, the resist 15 having a hexagonal shape is formed, the cut region of the side wall patterns 14b is cut by the lithography method, and as shown in FIG. 10C, the wiring patterns 11a, 11b similar to those of the fourth embodiment are formed.

(Eighth Embodiment)

Figure 11A:
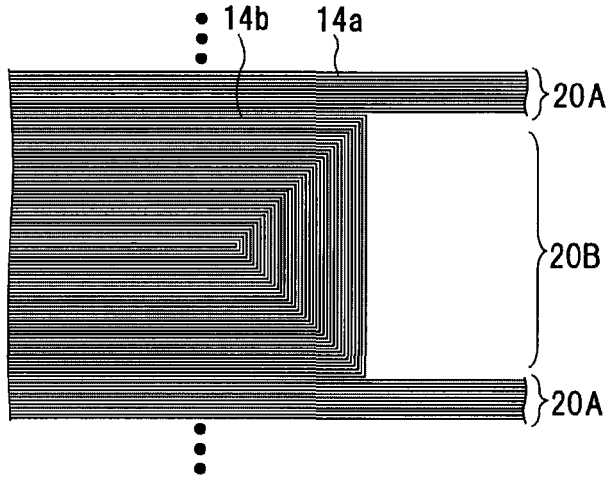
FIGS. 11A to 11C are main part plan views schematically showing each of upper wiring layers used in an example of a fabrication process according to an eighth embodiment.
Figure 11B:
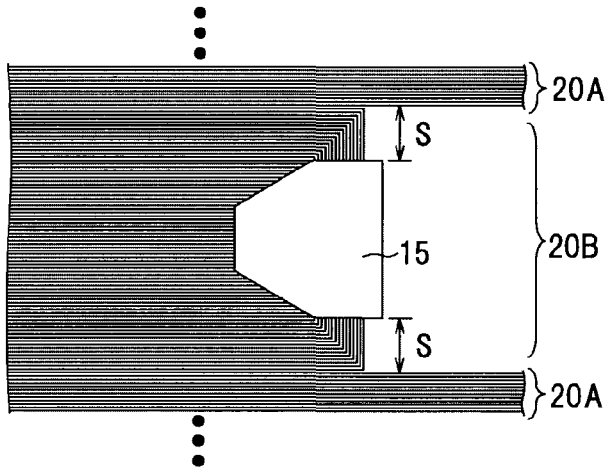
Figure 11C:
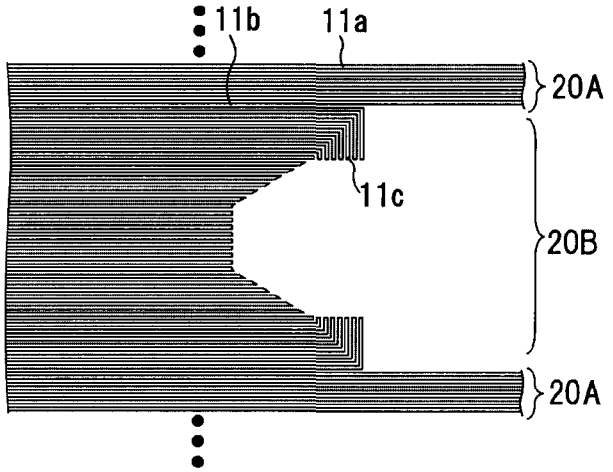

FIGS. 11A to 11C are main part plan views schematically showing each of upper wiring layers used in an example of a fabrication process according to the eighth embodiment. FIG. 11A corresponds to FIG. 1D, FIG. 11B corresponds to FIG. 2B, and FIG. 11C corresponds to FIG. 1H. Further, drawings corresponding to FIGS. 1A to 1C are omitted.

As shown in FIG. 11A, in the side wall patterns 14b constituting the second wiring pattern group 20B of the eighth embodiment, the side wall patterns 14b are connected each other so as to form a closed loop shape between two side wall patterns 14b, starting from the side wall patterns 14b closest to the first wiring pattern groups 20A.

After that, as shown in FIG. 11B, a space "S" is formed on the cut region located at the end portions of the side wall patterns 14b, between the first wiring pattern group 20A, the resist 15 having a hexagonal shape is formed, the cut region of the side wall patterns 14b is cut by the lithography method, and as shown in FIG. 11C, the wiring patterns 11a, 11b are formed.

According to the fourth to eighth embodiments, even if the side wall patterns formed by a line and space have an arrangement pitch less than the resolution limit "W" in lithography method, the closed loop cut of the side wall patterns can be carried out.

Next, the ninth to the thirteenth embodiments where the semiconductor device of the first embodiment is applied to a wiring by a line and space will be explained. The ninth to the thirteenth embodiments show a case that the wiring patterns 11a, 11b constituting each of wiring pattern groups 20A, 20B include thirty-six (36) lines of 20 nm in line width respectively.

(Ninth Embodiment)

Figure 12A:
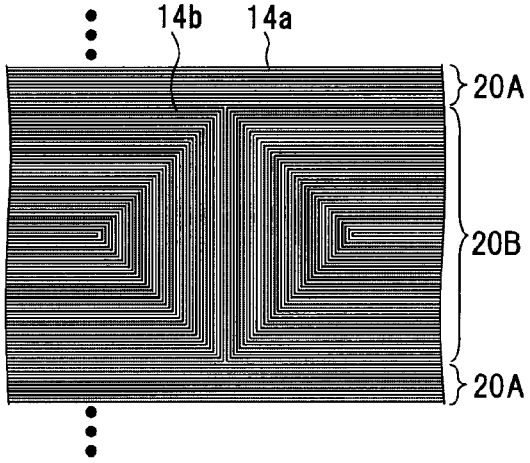
FIGS. 12A to 12C are main part plan views schematically showing each of upper wiring layers used in an example of a fabrication process according to a ninth embodiment.
Figure 12B:
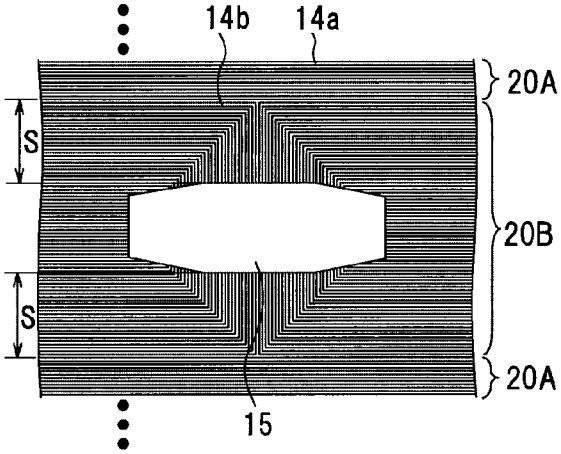
Figure 12C:
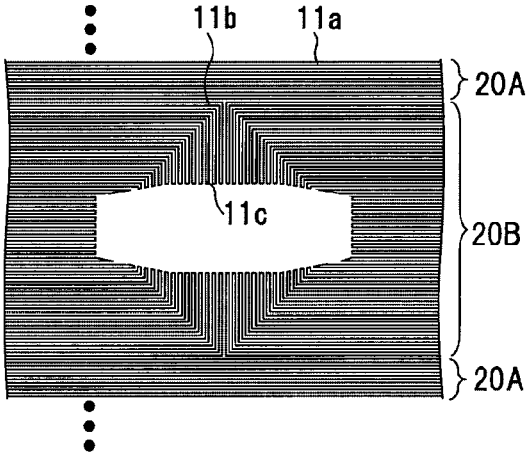

FIGS. 12A to 12C are main part plan views schematically showing each of upper wiring layers used in an example of a fabrication process according to the ninth embodiment. FIG. 12A corresponds to FIG. 1D, FIG. 12B corresponds to FIG. 2B, and FIG. 12C corresponds to FIG. 1H. Further, drawings corresponding to FIGS. 1A to 1C are omitted. Furthermore, the embodiment shows a case that the second wiring pattern groups 20B exist in the right-and-left sides.

As shown in FIG. 11A, in the side wall patterns 14b constituting the second wiring pattern group 20B of the ninth embodiment, the side wall patterns 14b are connected each other so as to form a closed loop shape between the side wall patterns 14b, starting from the side wall patterns 14b closest to the first wiring pattern groups 20A, and to provide a symmetrical appearance.

After that, as shown in FIG. 12B, a space "S" is formed on the cut region located at the end portions of the side wall patterns 14b, between the first wiring pattern group 20A, the resist 15 having an octagon shape is formed, the cut region of the side wall patterns 14b is cut by the lithography method, and as shown in FIG. 12C, the wiring patterns 11a, 11b are formed.

(Tenth Embodiment)

Figure 13A:
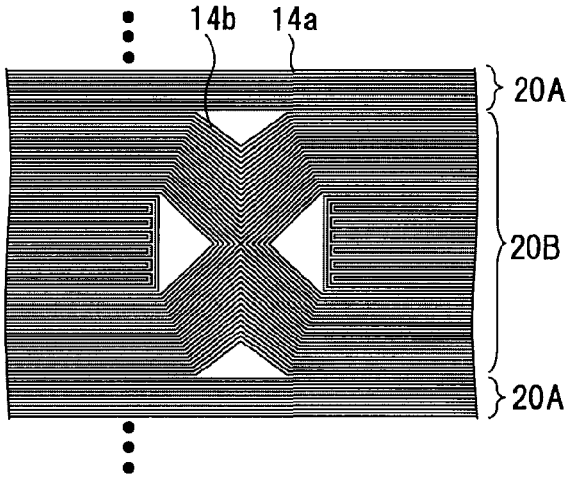
FIGS. 13A to 13C are main part plan views schematically showing each of upper wiring layers used in an example of a fabrication process according to a tenth embodiment.
Figure 13B:
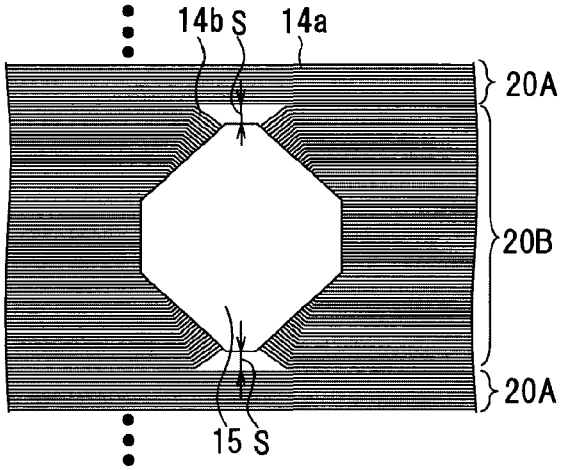
Figure 13C:
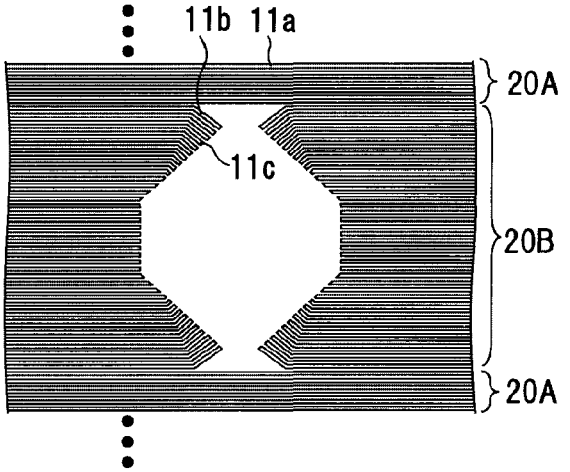

FIGS. 13A to 13C are main part plan views schematically showing each of upper wiring layers used in an example of a fabrication process according to the tenth embodiment. FIG. 13A corresponds to FIG. 1D, FIG. 13B corresponds to FIG. 2B, and FIG. 13C corresponds to FIG. 1H. Further, drawings corresponding to FIGS. 1A to 1C are omitted. Furthermore, the embodiment shows a case that the second wiring pattern groups 20B exist in the right-and-left sides.

As shown in FIG. 13A, in the side wall patterns 14b constituting the second wiring pattern group 20B of the tenth embodiment, sixteen (16) lines of the side wall patterns 14b located at the sides close to the first wiring pattern groups 20A are connected each other at the right-and-left end portions (not shown) so as to form the closed loop shapes between the side wall patterns 14b close to the first wiring pattern groups 20A. Further, ten (10) lines of the side wall patterns 14b located interiorly are connected each other so as to form the closed loop shape between the side wall patterns 14b, starting from the side wall patterns 14b closest to the first wiring pattern groups 20A, and so as to provide a symmetrical appearance. Further, ten (10) lines of the side wall patterns 14b located further interiorly form the closed loop shapes between the side wall patterns 14b adjacent to each other, and provide a symmetrical appearance.

After that, as shown in FIG. 13B, a space "S" is formed on the cut region located at the end portions of the side wall patterns 14b, between the first wiring pattern group 20A, the resist 15 having an octagon shape is formed, the cut region of the side wall patterns 14b is cut by the lithography method, and as shown in FIG. 13C, the wiring patterns 11a, 11b are formed.

(Eleventh Embodiment)

Figure 14A:
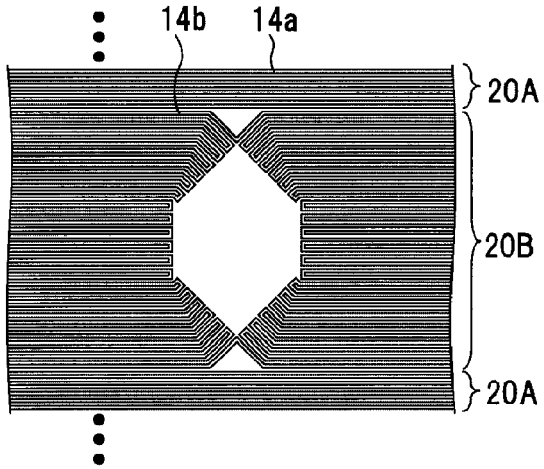
FIGS. 14A to 14C are main part plan views schematically showing each of upper wiring layers used in an example of a fabrication process according to an eleventh embodiment.
Figure 14B:
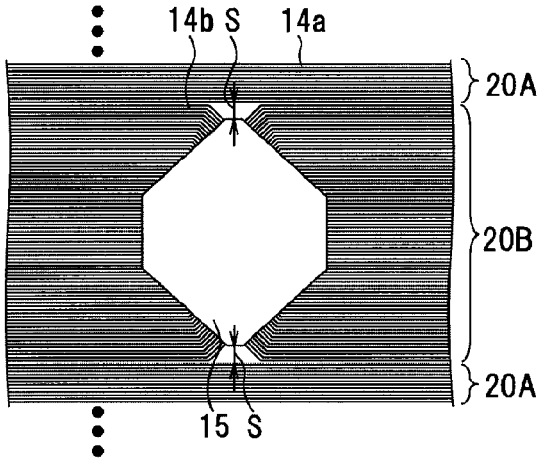
Figure 14C:
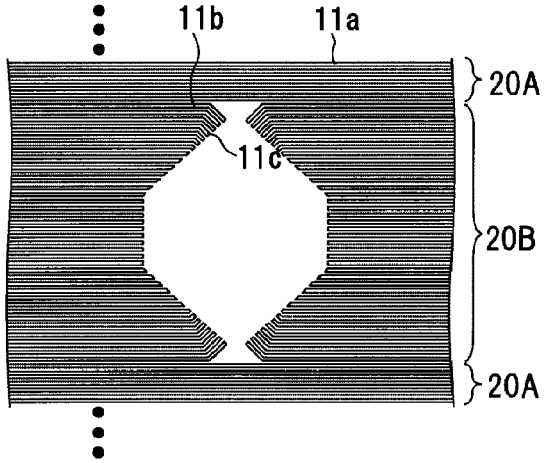

FIGS. 14A to 14C are main part plan views schematically showing each of upper wiring layers used in an example of a fabrication process according to the eleventh embodiment. FIG. 14A corresponds to FIG. 1D, FIG. 14B corresponds to FIG. 2B, and FIG. 14C corresponds to FIG. 1H. Further, drawings corresponding to FIGS. 1A to 1C are omitted. Furthermore, the embodiment shows a case that the second wiring pattern groups 20B exist in the right-and-left sides.

As shown in FIG. 14A, in the side wall patterns 14b constituting the second wiring pattern group 20B of the eleventh embodiment, two (2) lines of the side wall patterns 14b located at the sides closest to the first wiring pattern groups 20A are connected each other at the right-and-left end portions (not shown) so as to form a loop shape between the two side wall patterns 14b, and the other side wall patterns 14b located interiorly form the loop shapes between the side wall patterns 14b adjacent to each other, and provide a symmetrical appearance.

After that, as shown in FIG. 14B, a space "S" is formed on the cut region located at the end portions of the side wall patterns 14b, between the first wiring pattern group 20A, the resist 15 having an octagon shape is formed, the cut region of the side wall patterns 14b is cut by the lithography method, and as shown in FIG. 14C, the wiring patterns 11a, 11b are formed.

(Twelfth Embodiment)

Figure 15A:
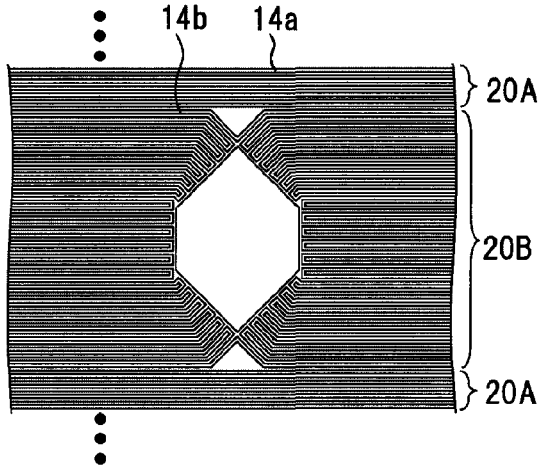
FIGS. 15A to 15C are main part plan views schematically showing each of upper wiring layers used in an example of a fabrication process according to a twelfth embodiment.
Figure 15B:
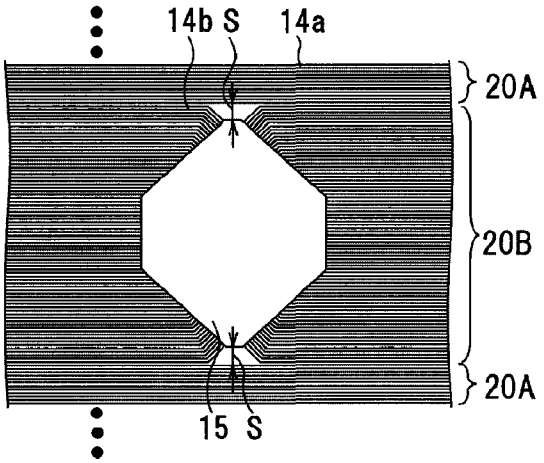
Figure 15C:
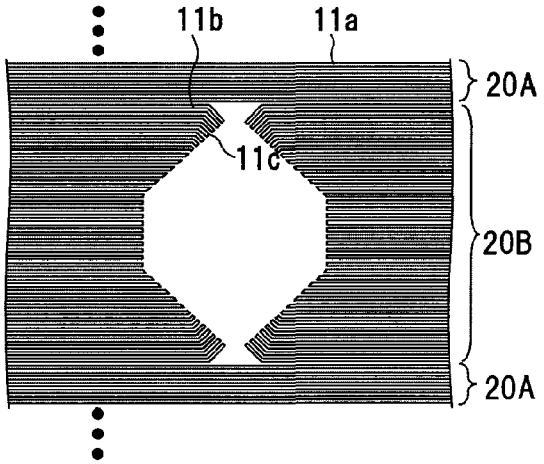

FIGS. 15A to 15C are main part plan views schematically showing each of upper wiring layers used in an example of a fabrication process according to the twelfth embodiment. FIG. 15A corresponds to FIG. 1D, FIG. 15B corresponds to FIG. 2B, and FIG. 15C corresponds to FIG. 1H. Further, drawings corresponding to FIGS. 1A to 1C are omitted. Furthermore, the embodiment shows a case that the second wiring pattern groups 20B exist in the right-and-left sides.

As shown in FIG. 15A, the side wall patterns 14b constituting the second wiring pattern group 20B of the twelfth embodiment have a structure that a side wall pattern 14b having a hexagonal shape in the center portion is added to the side wall patterns 14b of the eleventh embodiment, and the other parts are formed similarly to those of the eleventh embodiment.

After that, as shown in FIG. 15B, a space "S" is formed on the cut region located at the end portions of the side wall patterns 14b, between the first wiring pattern group 20A, the resist 15 having an octagon shape is formed, the cut region of the side wall patterns 14b is cut by the lithography method, and as shown in FIG. 15C, the wiring patterns 11a, 11b similar to those of the eighth embodiment are formed.

(Thirteenth Embodiment)

Figure 16A:
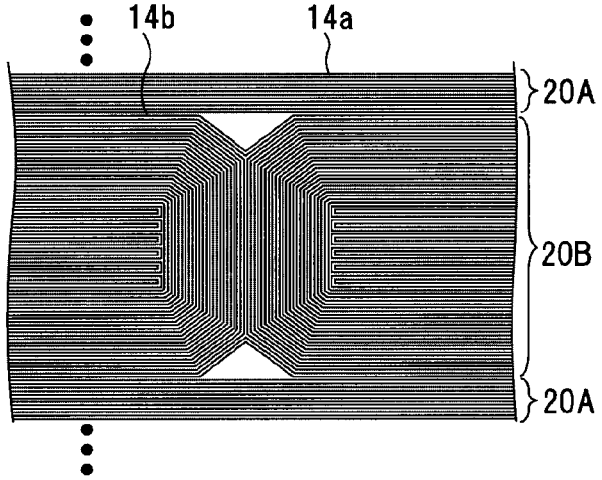
FIGS. 16A to 16C are main part plan views schematically showing each of upper wiring layers used in an example of a fabrication process according to a thirteenth embodiment.
Figure 16B:
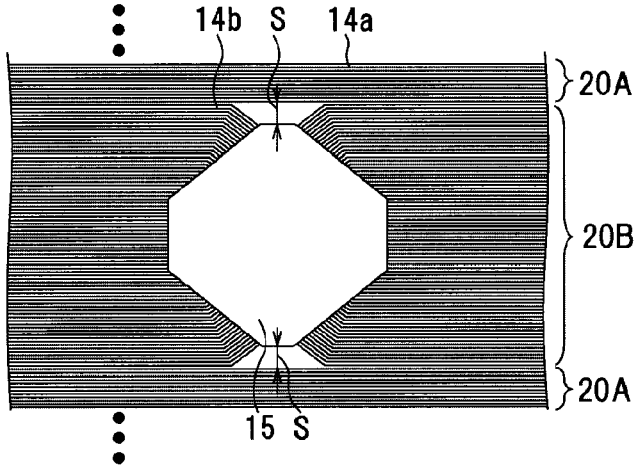
Figure 16C:
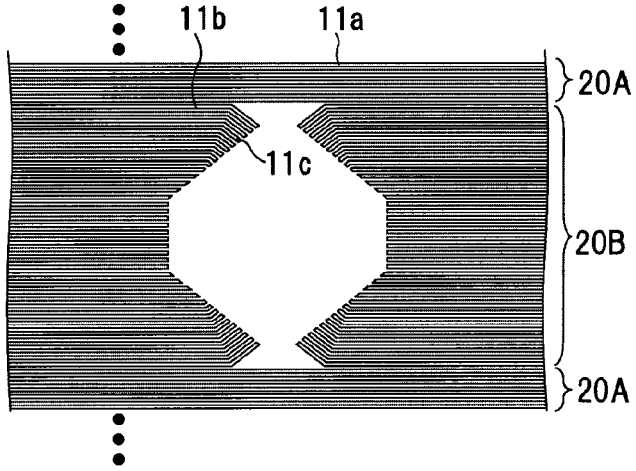

FIGS. 16A to 16C are main part plan views schematically showing each of upper wiring layers used in an example of a fabrication process according to the thirteenth embodiment. FIG. 16A corresponds to FIG. 1D, FIG. 16B corresponds to FIG. 2B, and FIG. 16C corresponds to FIG. 1H. Further, drawings corresponding to FIGS. 1A to 1C are omitted. Furthermore, the embodiment shows a case that the second wiring pattern groups 20B exist in the right-and-left sides.

As shown in FIG. 16A, in the side wall patterns 14b constituting the second wiring pattern group 20B of the thirteenth embodiment, two (2) lines of the side wall patterns 14b located at the sides closest to the first wiring pattern groups 20A are connected each other at the right-and-left end portions (not shown) so as to form a loop shape between the two side wall patterns 14b. Further, twenty-four (24) lines of the side wall patterns 14b located interiorly form the loop shapes between the side wall patterns 14b, from the parts located externally to the parts located internally in order, and provide a symmetrical appearance. Ten (10) lines of the side wall patterns 14b located further interiorly form the loop shapes between the side wall patterns 14b adjacent to each other, and provide a symmetrical appearance.

After that, as shown in FIG. 16B, a space "S" is formed on the cut region located at the end portions of the side wall patterns 14b, between the first wiring pattern group 20A, the resist 15 having an octagon shape is formed, the cut region of the side wall patterns 14b is cut by the lithography method, and as shown in FIG. 16C, the wiring patterns 11a, 11b similar to those of the seventh embodiment are formed.

Next, the fourteenth to the seventeenth embodiments where the semiconductor device of the second embodiment is applied to a phase-change memory will be explained. The fourteenth to the seventeenth embodiments show a case that the wiring patterns 11a, 11b constituting each of wiring pattern groups 20A, 20B include thirty-three (33) lines of 20 nm in line width respectively.

Figure 17A:
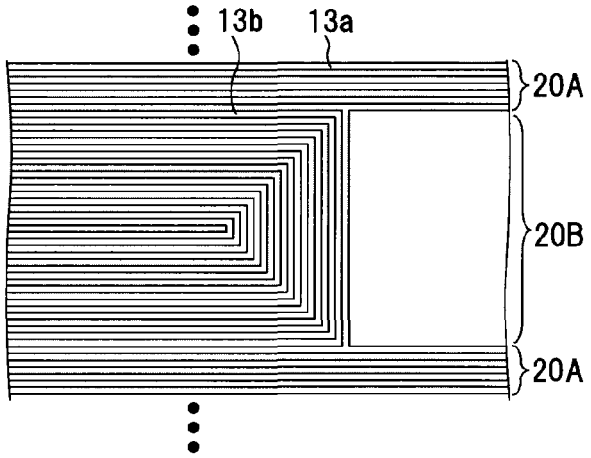
FIGS. 17A to 17H are main part plan views schematically showing each of upper wiring layers used in an example of a fabrication process according to a fourteenth embodiment.
Figure 17B:
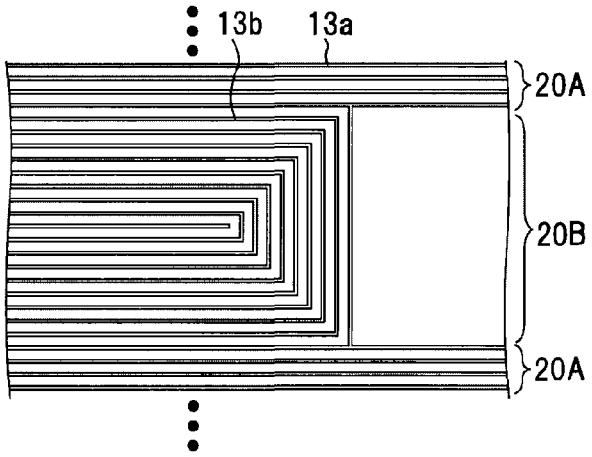
Figure 17C:
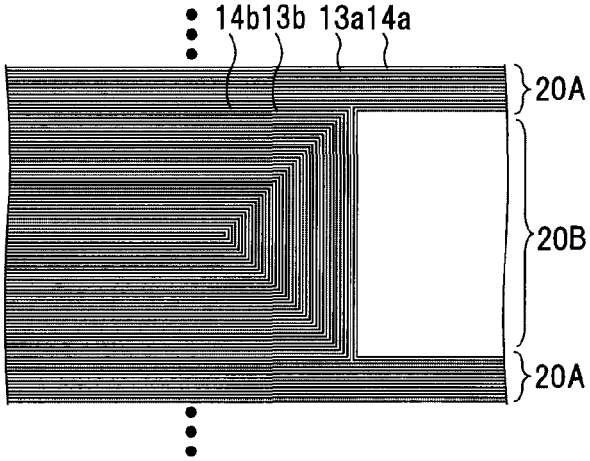
Figure 17D:
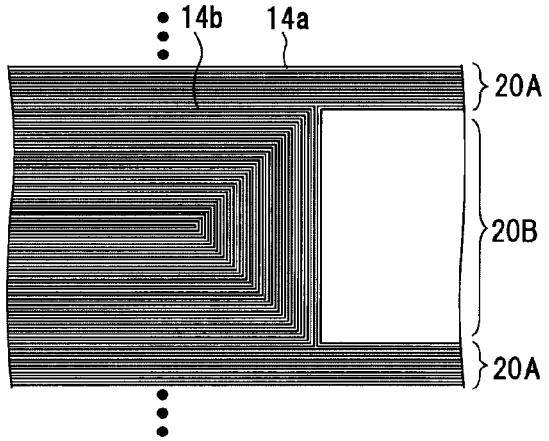
Figure 17E:
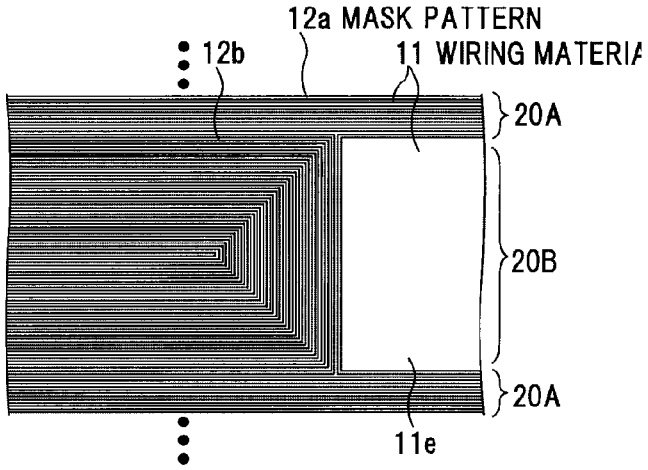
Figure 17F:
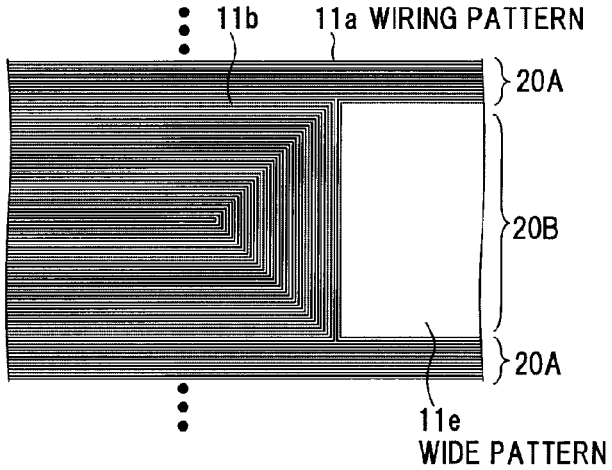
Figure 17G:
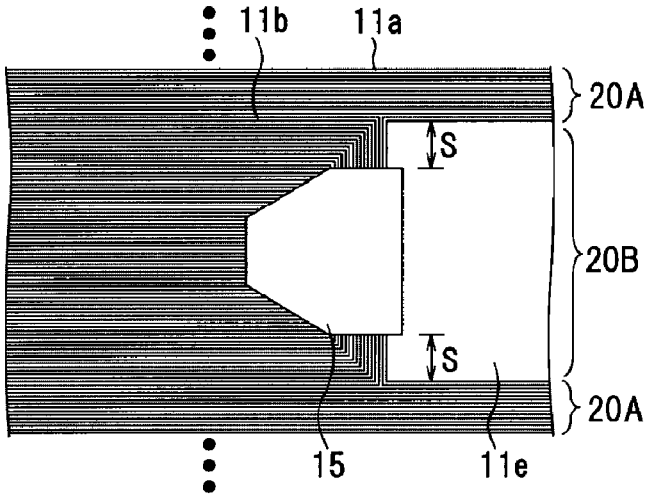

FIGS. 17A to 17H are main part plan views schematically showing each of upper wiring layers used in an example of a fabrication process according to the fourteenth embodiment. FIGS. 17A to 17D correspond to FIGS. 3A to 3D, FIG. 17E corresponds to FIG. 3G, and FIG. 17F corresponds to FIG. 3H. FIG. 17G corresponds to FIG. 4B, and FIG. 17H corresponds to FIG. 4C.

Similarly to the second embodiment, as shown in FIG. 17A, after a mask material is formed on a foundation layer, core patterns 13a, 13b are formed on the mask material. The core patterns 13b constituting the second wiring pattern group 20B are connected each other so as to form a closed loop shape between two core patterns 13b, starting from the two side wall patterns 14b closest to the first wiring pattern groups 20A.

Next, as shown in FIG. 17B, a slimming treatment of the core patterns 13a, 13b is carried out, and as shown in FIG. 17C, side wall patterns 14a, 14b are formed on the side surfaces of the core patterns 13a, 13b after the slimming treatment, and as shown in FIG. 17D, the core patterns 13a, 13b are eliminate by an etching so as to leave the side wall patterns 14a, 14b.

Next, as shown in FIG. 17E, the mask material is eliminated by an etching and by using the side wall patterns 14a, 14b as a mask so as to form mask patterns, and the side wall patterns 14a, 14b are eliminated.

Next, as shown in FIG. 17E, the wiring material 11 is filled in the peripheral of the mask patterns 12a, 12b.

Next, as shown in FIG. 17F, the mask patterns 12a, 12b are eliminated so as to form wiring patterns 11a, 11b. The wiring patterns 11a, 11b form closed loop shapes. Wide patterns 11e are formed between the wiring pattern groups 20A.

Figure 17H:
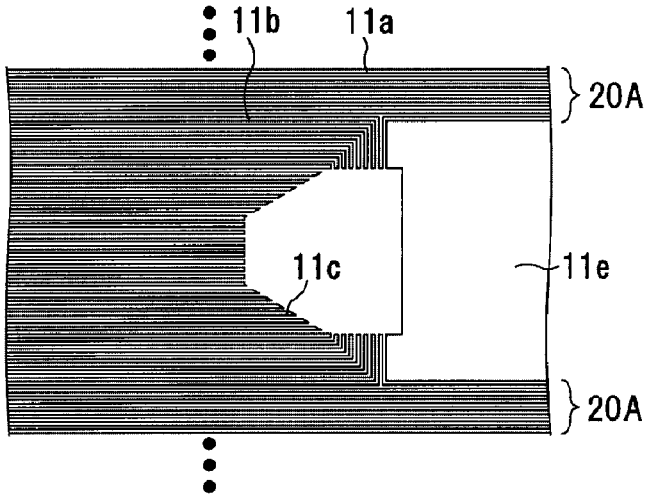

Next, as shown in FIG. 17G, a space "S" is formed on the cut region located at the end portions of the wiring patterns 11b, between the first wiring pattern group 20A, the resist 15 having a hexagonal shape is formed, the cut region of the wiring patterns 11b is cut by the lithography method, and as shown in FIG. 17H, the wiring patterns 11a, 11b are formed.

(Fifteenth Embodiment)

Figure 18A:
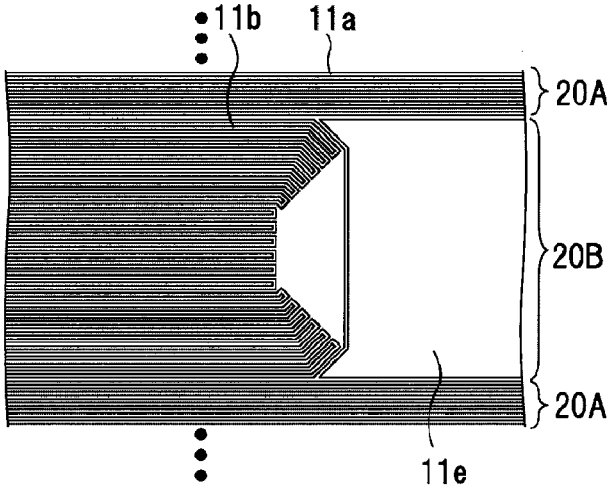
FIGS. 18A to 18C are main part plan views schematically showing each of upper wiring layers used in an example of a fabrication process according to a fifteenth embodiment.
Figure 18B:
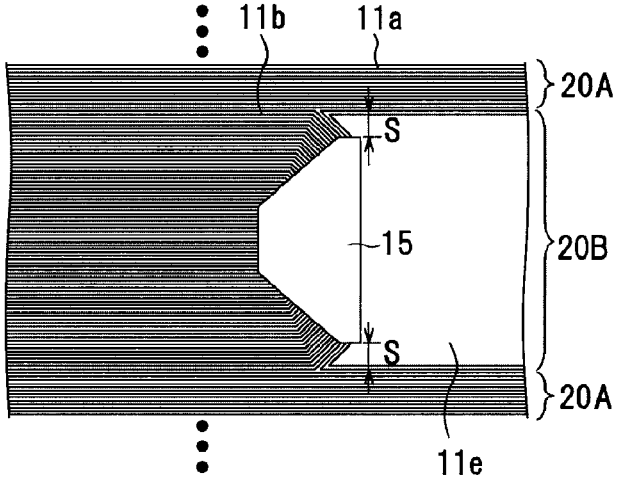
Figure 18C:
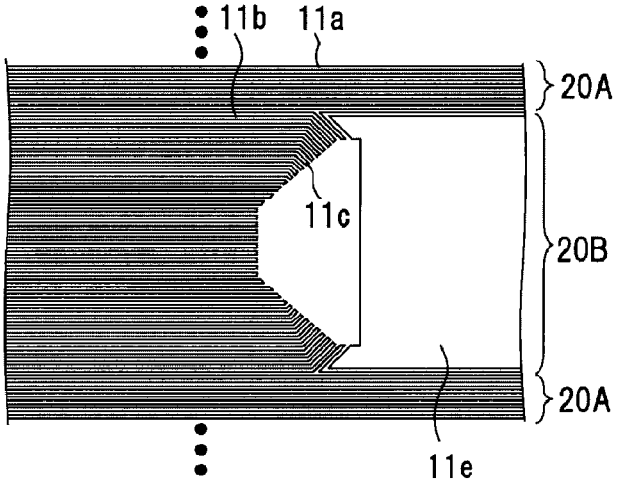

FIGS. 18A to 18C are main part plan views schematically showing each of upper wiring layers used in an example of a fabrication process according to a fifteenth embodiment. FIG. 18A corresponds to FIG. 3H. FIG. 18B corresponds to FIG. 4B, and FIG. 18C corresponds to FIG. 4C. Further, drawings corresponding to FIGS. 3A to 3G are omitted.

As shown in FIG. 18A, the wiring patterns 11b constituting the second wiring pattern group 20B of the fifteenth embodiment are connected each other on alternate lines so as to form closed loop shapes between the wiring patterns 11b, further, the wiring patterns 11a of the wiring pattern groups 20A closest to the first wiring pattern group 20B are also connected each other so as to form a closed loop shape between the wiring patterns 11a.

After that, as shown in FIG. 18B, a space "S" is formed on the cut region located at the end portions of the wiring patterns 11b, between the first wiring pattern group 20A, the resist 15 having a hexagonal shape is formed, the cut region of the wiring patterns 11b is cut by the lithography method, and as shown in FIG. 18C, the wiring patterns 11a, 11b are formed.

(Sixteenth Embodiment)

Figure 19A:
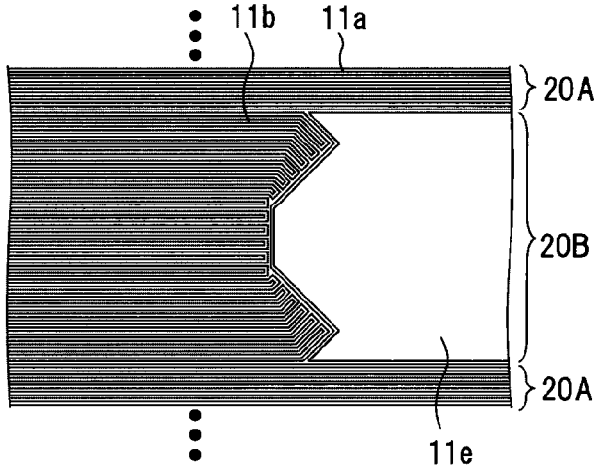
FIGS. 19A to 19C are main part plan views schematically showing each of upper wiring layers used in an example of a fabrication process according to a sixteenth embodiment.
Figure 19B:
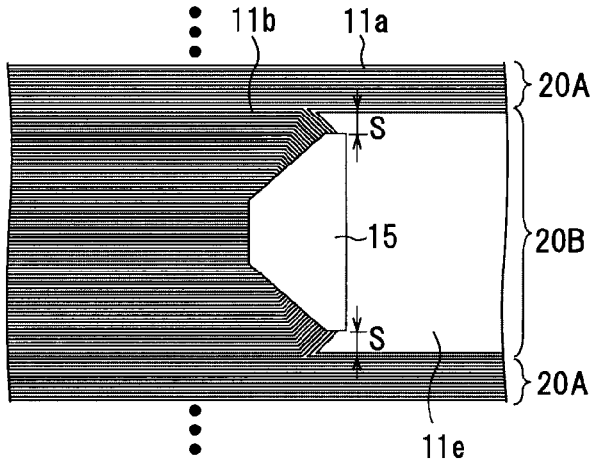
Figure 19C:
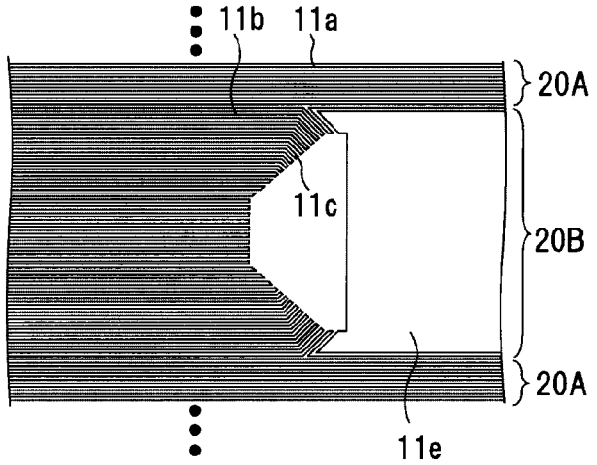

FIGS. 19A to 19C are main part plan views schematically showing each of upper wiring layers used in an example of a fabrication process according to the sixteenth embodiment. FIG. 19A corresponds to FIG. 3H. FIG. 19B corresponds to FIG. 4B, and FIG. 19C corresponds to FIG. 4C. Further, drawings corresponding to FIGS. 3A to 3G are omitted.

As shown in FIG. 19A, the wiring patterns 11b constituting the second wiring pattern group 20B of the sixteenth embodiment are connected each other on alternate lines so as to form closed loop shapes between the wiring patterns 11b, further, the wiring patterns 11a of the wiring pattern groups 20A closest to the first wiring pattern group 20B are also connected each other so as to form a closed loop shape between the wiring patterns 11a.

After that, as shown in FIG. 19B, a space "S" is formed on the cut region located at the end portions of the wiring patterns 11b, between the first wiring pattern group 20A, the resist 15 having a hexagonal shape is formed, the cut region of the wiring patterns 11b is cut by the lithography method, and as shown in FIG. 19C, the wiring patterns 11a, 11b similar to those of the twelfth embodiment are formed.

Figure 20A:
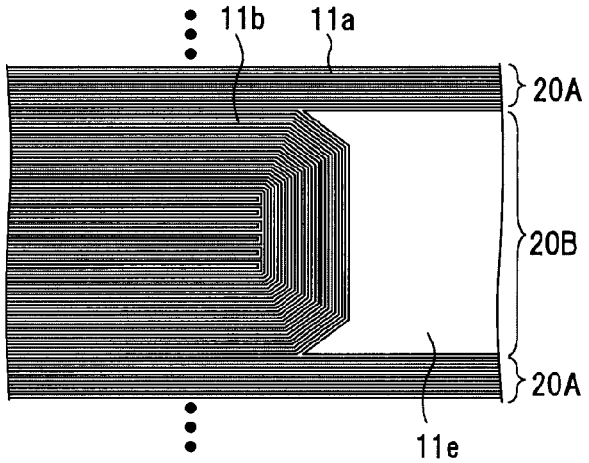
FIGS. 20A to 20C are main part plan views schematically showing each of upper wiring layers used in an example of a fabrication process according to a seventeenth embodiment.
Figure 20B:
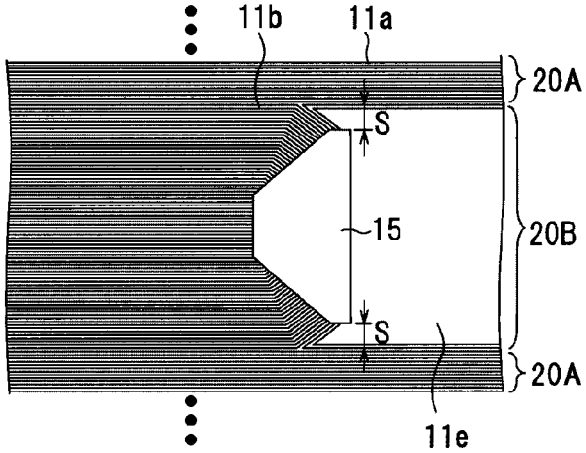
Figure 20C:
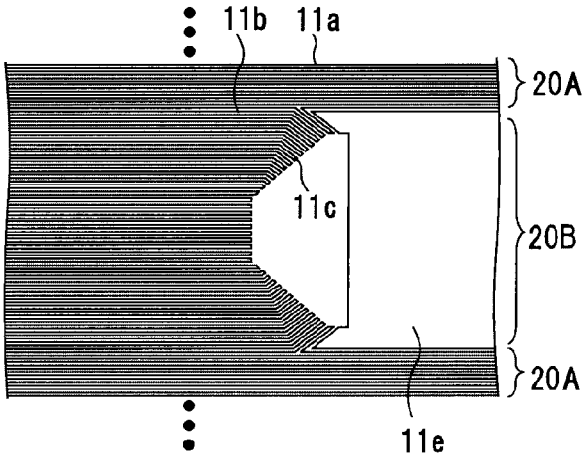

FIGS. 20A to 20C are main part plan views schematically showing an example of a fabrication process according to a seventeenth embodiment (Seventeenth Embodiment)

FIGS. 20A to 20C are main part plan views schematically showing each of upper wiring layers used in an example of a fabrication process according to the seventeenth embodiment. FIG. 20A corresponds to FIG. 3H. FIG. 20B corresponds to FIG. 4B, and FIG. 20C corresponds to FIG. 4C. Further, drawings corresponding to FIGS. 3A to 3G are omitted.

As shown in FIG. 20A, in the wiring patterns 11b constituting the second wiring pattern group 20B of the seventeenth embodiment, twenty-four (24) lines of the wiring patterns 11b located at the side close to the first wiring pattern group 20A are connected each other so as to form a closed loop shape between two wiring patterns 11b, starting from the two wiring patterns 11b closest to the first wiring pattern groups 20A. Further, nine (9) lines of the wiring patterns 11b located interiorly are connected alternatively to the wiring patterns 11b having a closed loop shape and located most interiorly. Furthermore, the wiring patterns 11a of the wiring pattern groups 20A closest to the first wiring pattern group 20B are also connected each other so as to form a closed loop shape between the wiring patterns 11a.

After that, as shown in FIG. 20B, a space "S" is formed on the cut region located at the end portions of the wiring patterns 11b, between the first wiring pattern group 20A, the resist 15 having a hexagonal shape is formed, the cut region of the wiring patterns 11b is cut by the lithography method, and as shown in FIG. 20C, the wiring patterns 11a, 11b are formed.

Next, the eighteenth to twenty-second the embodiments where the semiconductor device of the second embodiment is applied to a wiring by a line and space will be explained. The eighteenth to twenty-second embodiments show a case that the wiring patterns 11a, 11b constituting each of wiring pattern groups 20A, 20B include thirty-six (36) lines of 20 nm in line width respectively.

(Eighteenth Embodiment)

Figure 21A:
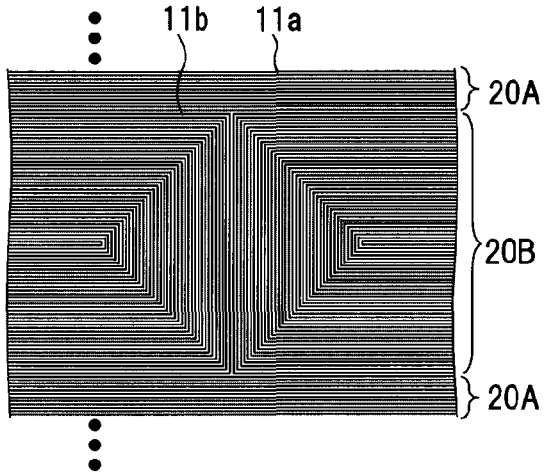
FIGS. 21A to 21C are main part plan views schematically showing each of upper wiring layers used in an example of a fabrication process according to an eighteenth embodiment.
Figure 21B:
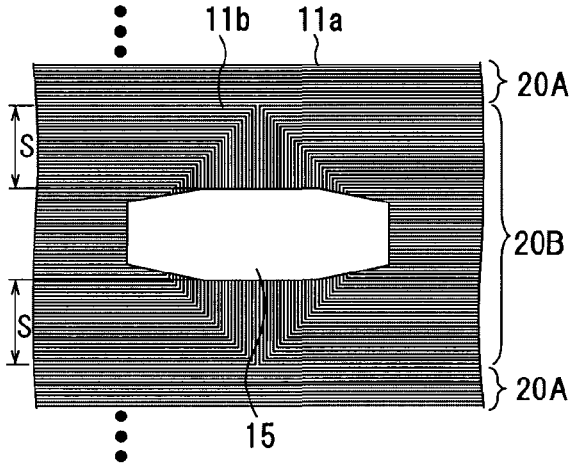
Figure 21C:
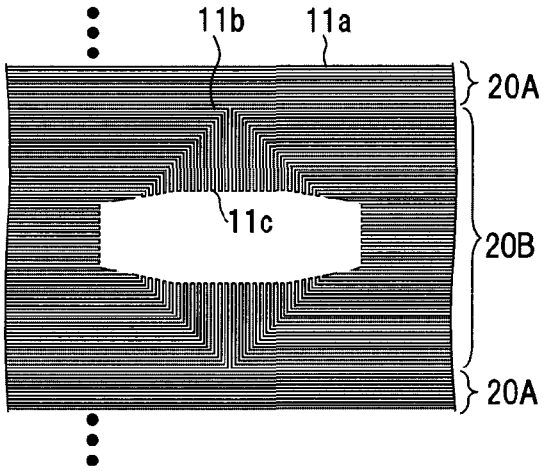

FIGS. 21A to 21C are main part plan views schematically showing each of upper wiring layers used in an example of a fabrication process according to the eighteenth embodiment. FIG. 21A corresponds to FIG. 4A, FIG. 21B corresponds to FIG. 4B, and FIG. 21C corresponds to FIG. 4C. Further, drawings corresponding to FIGS. 3A to 3G are omitted. Furthermore, the embodiment shows a case that the second wiring pattern groups 20B exist in the right-and-left sides.

As shown in FIG. 21A, in the wiring patterns 11b constituting the second wiring pattern group 20B of the eighteenth embodiment, thirty-two (32) lines of the wiring patterns 11b except for the lines centrally located are connected each other so as to form a closed loop shape between the wiring patterns 11b, starting from the wiring patterns 11b closest to the first wiring pattern groups 20A, and to provide a symmetrical appearance.

After that, as shown in FIG. 21B, a space "S" is formed on the cut region located at the end portions of the wiring patterns 11b, between the first wiring pattern group 20A, the resist 15 having an octagon shape is formed, the cut region of the wiring patterns 11b is cut by the lithography method, and as shown in FIG. 21C, the wiring patterns 11a, 11b are formed.

(Nineteenth Embodiment)

Figure 22A:
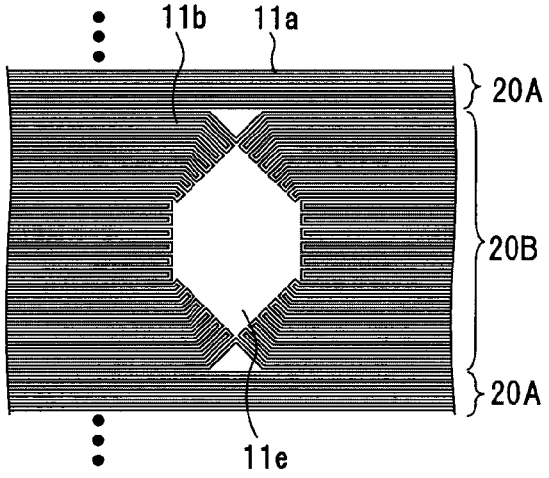
FIGS. 22A to 22C are main part plan views schematically showing each of upper wiring layers used in an example of a fabrication process according to a nineteenth embodiment.
Figure 22B:
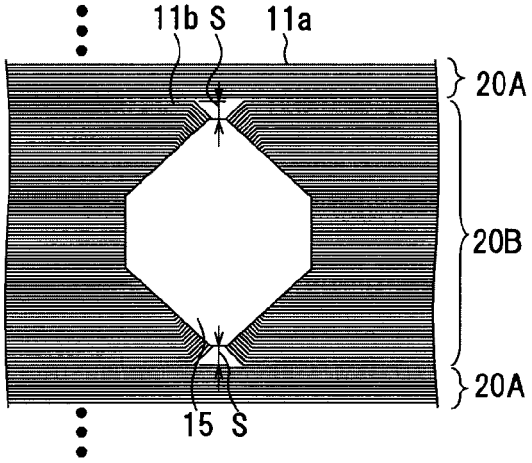
Figure 22C:
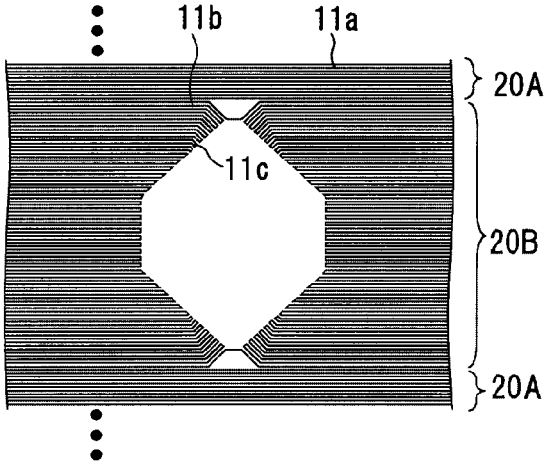

FIGS. 22A to 22C are main part plan views schematically showing each of upper wiring layers used in an example of a fabrication process according to the nineteenth embodiment. FIG. 22A corresponds to FIG. 4A, FIG. 22B corresponds to FIG. 4B, and FIG. 22C corresponds to FIG. 4C. Further, drawings corresponding to FIGS. 3A to 3G are omitted. Furthermore, the embodiment shows a case that the second wiring pattern groups 20B exist in the right-and-left sides.

As shown in FIG. 22A, the wiring patterns 11b constituting the second wiring pattern group 20B of the nineteenth embodiment are alternatively connected to the wide patterns 11e formed in the center portion so as to form the closed loop shapes and to provide a symmetrical appearance. Further, the wiring patterns 11a of the first wiring pattern groups 20A closest to the second wiring pattern group 20B include a part (a triangular shape) having a wide line width formed in the vicinity of the cut region where the closed loop cut is carried out.

After that, as shown in FIG. 22B, a space "S" is formed on the cut region located at the end portions of the wiring patterns 11b, between the first wiring pattern group 20A, the resist 15 having a hexagonal shape is formed, the cut region of the wiring patterns 11b is cut by the lithography method, and as shown in FIG. 22C, the wiring patterns 11a, 11b similar to those of the twelfth embodiment are formed.

(Twentieth Embodiment)

Figure 23A:
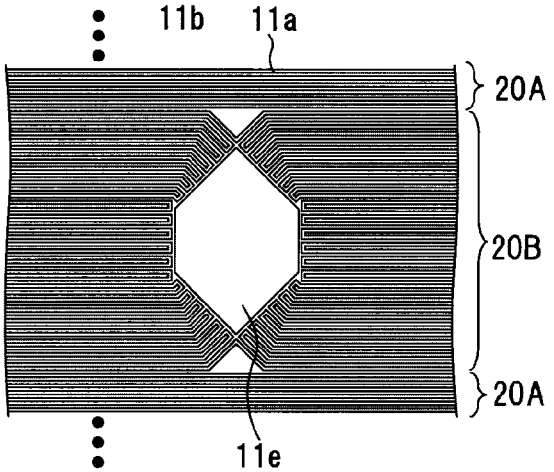

FIGS. 23A to 24C are main part plan views schematically showing each of upper wiring layers used in an example of a fabrication process according to the twentieth embodiment. FIG. 23A corresponds to FIG. 4A, FIG. 23B corresponds to FIG. 4B, and FIG. 23C corresponds to FIG. 4C. Further, drawings corresponding to FIGS. 3A to 3G are omitted. Furthermore, the embodiment shows a case that the second wiring pattern groups 20B exist in the right-and-left sides.

As shown in FIG. 23A, the wiring patterns 11b constituting the second wiring pattern group 20B of the twentieth embodiment are alternatively connected to circular patterns formed in the periphery of the wide patterns 11e centrally located so as to form the closed loop shapes and to provide a symmetrical appearance. Further, the wiring patterns 11a of the first wiring pattern groups 20A closest to the second wiring pattern group 20B include a part (a triangular shape) having a wide line width formed in the vicinity of the cut region where the closed loop cut is carried out.

Figure 23B:
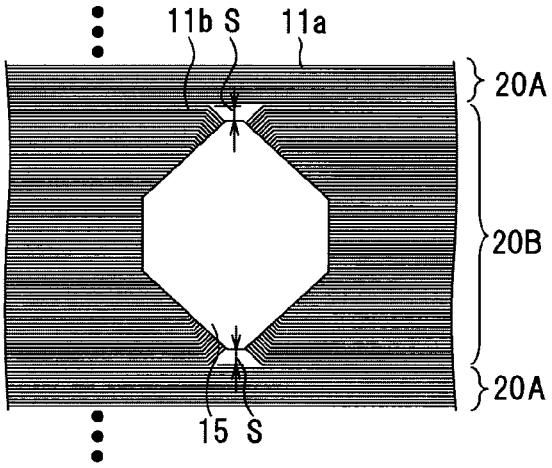
Figure 23C:
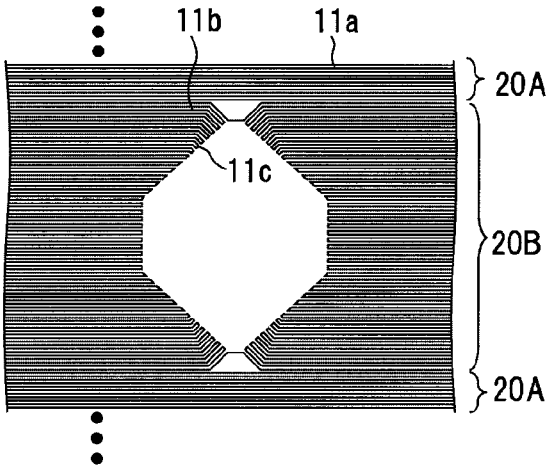

After that, as shown in FIG. 23B, a space "S" is formed on the cut region located at the end portions of the wiring patterns 11b, between the first wiring pattern group 20A, the resist 15 having a hexagonal shape is formed, the cut region of the wiring patterns 11b is cut by the lithography method, and as shown in FIG. 23C, the wiring patterns 11a, 11b are formed.

(Twenty-First Embodiment)

Figure 24A:
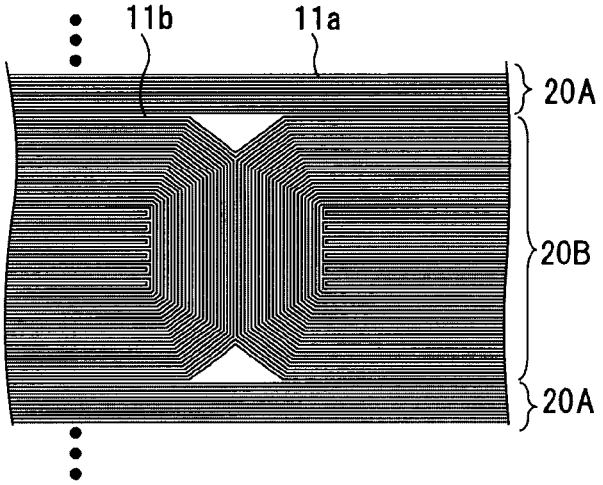
Figure 24B:
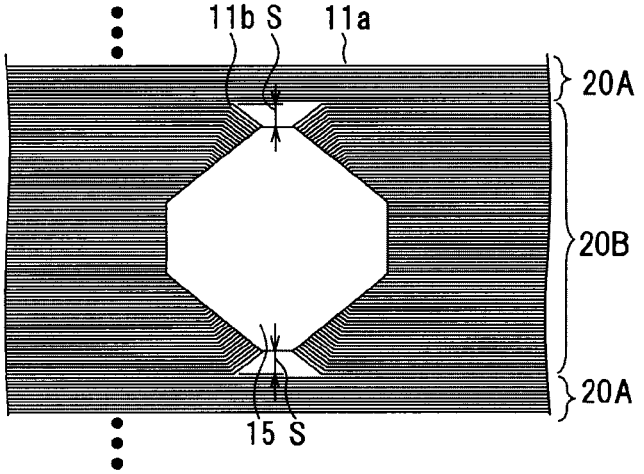
Figure 24C:
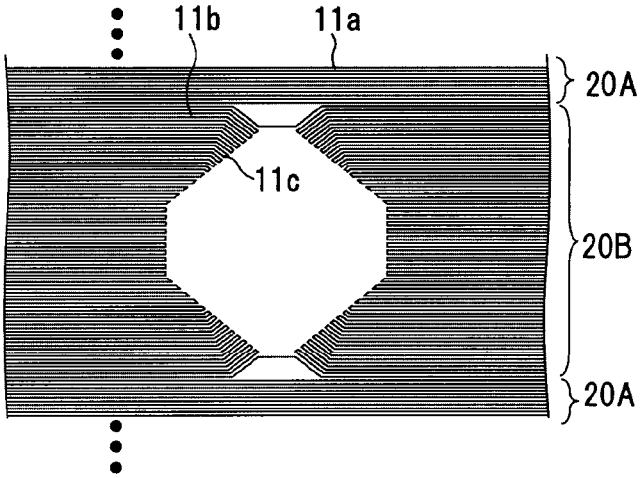

FIGS. 24A to 24C are main part plan views schematically showing each of upper wiring layers used in an example of a fabrication process according to a twenty-first embodiment. FIG. 24A corresponds to FIG. 4A, FIG. 24B corresponds to FIG. 4B, and FIG. 24C corresponds to FIG. 4C. Further, drawings corresponding to FIGS. 3A to 3G are omitted. Furthermore, the embodiment shows a case that the second wiring pattern groups 20B exist in the right-and-left sides.

As shown in FIG. 21A, in the wiring patterns 11b constituting the second wiring pattern group 20B of the twenty-first embodiment, twenty-six (26) lines of the wiring patterns 11b located at the side close to the first wiring pattern group 20A are connected each other so as to form a closed loop shape between two wiring patterns 11b, starting from the two wiring patterns 11b closest to the first wiring pattern groups 20A, and so as to provide a symmetrical appearance. Further, the ten (10) lines of the wiring patterns 11b located interiorly are alternatively connected to the wiring patterns 11b having a closed loop shape and located interiorly, and provide a symmetrical appearance. Further, the wiring patterns 11a of the first wiring pattern groups 20A closest to the second wiring pattern group 20B include a part (a triangular shape) having a wide line width formed in the vicinity of the cut region where the closed loop cut is carried out.

After that, as shown in FIG. 24B, a space "S" is formed on the cut region located at the end portions of the wiring patterns 11b, between the first wiring pattern group 20A, the resist 15 having an octagon shape is formed, the cut region of the wiring patterns 11b is cut by the lithography method, and as shown in FIG. 24C, the wiring patterns 11a, 11b are formed.

(Twenty-Second Embodiment)

Figure 25A:
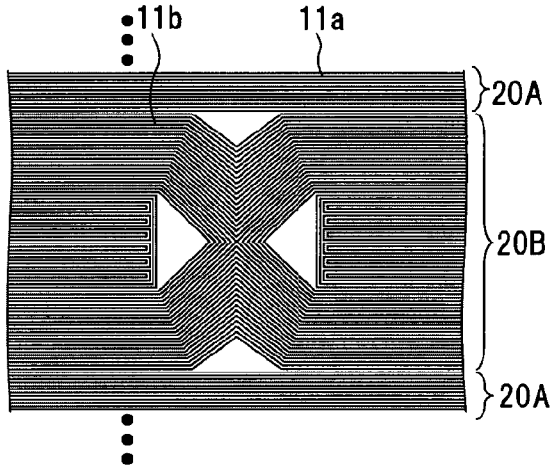
FIGS. 25A to 25C are main part plan views schematically showing each of upper wiring layers used in an example of a fabrication process according to a twenty-second embodiment.
Figure 25B:
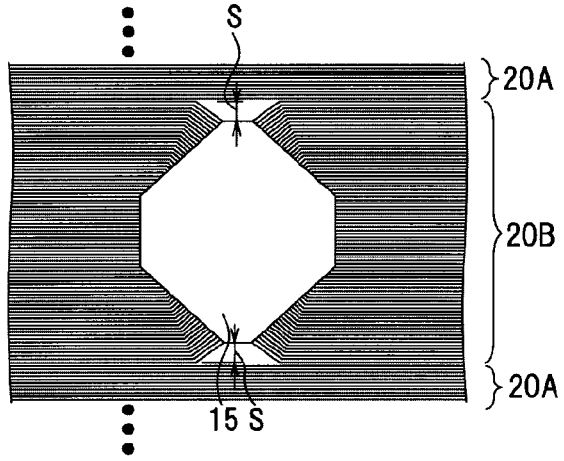
Figure 25C:
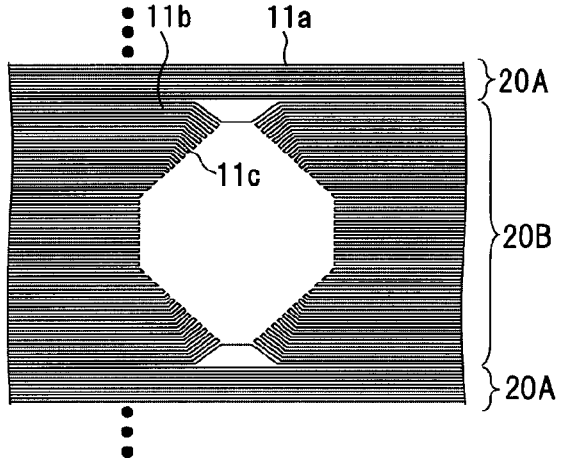

FIGS. 25A to 25C are main part plan views schematically showing each of upper wiring layers used in an example of a fabrication process according to the twenty-second embodiment. FIG. 25A corresponds to FIG. 4A, FIG. 25B corresponds to FIG. 4B, and FIG. 25C corresponds to FIG. 4C. Further, drawings corresponding to FIGS. 3A to 3G are omitted. Furthermore, the embodiment shows a case that the second wiring pattern groups 20B exist in the right-and-left sides.

As shown in FIG. 25A, in the wiring patterns 11b constituting the second wiring pattern group 20B of the twenty-second embodiment, twenty-two (22) lines of the wiring patterns 11b located at the side close to the first wiring pattern group 20A form the closed loop shapes between the wiring patterns 11b in the right-and-left end portions (not shown) Further, the four (4) lines of the wiring patterns 11b located interiorly are connected each other so as to form a closed loop shape between the wiring patterns 11b, starting from the wiring patterns 11b closest to the first wiring pattern groups 20A, and so as to provide a symmetrical appearance. Further, nine (9) lines of the wiring patterns 11b located further interiorly are alternatively connected to the closed loop shapes located interiorly so as to provide a symmetrical appearance. Further, the wiring patterns 11a of the first wiring pattern groups 20A closest to the second wiring pattern group 20B include a part (a triangular shape) having a wide line width formed in the vicinity of the cut region where the closed loop cut is carried out.

After that, as shown in FIG. 25B, a space "S" is formed on the cut region located at the end portions of the wiring patterns 11b, between the first wiring pattern group 20A, the resist 15 having an octagon shape is formed, the cut region of the wiring patterns 11b is cut by the lithography method, and as shown in FIG. 25C, the wiring patterns 11a, 11b are formed.

Further, it should be noted that the present invention is not intended to be limited to the above-mentioned embodiments, and the various kinds of changes thereof can be implemented by those skilled in the art without departing from the gist of the invention.

What is claimed is:

1. A method of fabricating a semiconductor device, comprising:

forming a first pattern and a second pattern, the first pattern having linear parts of a constant line width, and the second pattern having parallel parts parallel to the linear parts and nonlinear parts not parallel to the linear parts, wherein:

the parallel parts are at a first distance away from the linear parts, the parallel parts and the nonparallel parts are connected to each other at joining points, the nonparallel parts bend from the joining points in a direction away from the linear parts, and the second pattern is formed in a closed loop shape; and forming a resist over the nonparallel parts, a point on the resist, which is closest to the linear parts, being at a second distance away from the linear parts, the second distance being larger than the first distance; and carrying out a closed loop cut at a region covered by the resist.

2. The method of fabricating a semiconductor device according to claim 1, wherein:

the second pattern is formed such that the nonparallel parts are connected to form the closed loop shape.

3. The method of fabricating a semiconductor device according to claim 1, wherein:

the first pattern is formed in a closed loop shape, and forming the first pattern and the second pattern comprises:

forming core patterns on a foundation layer, forming side wall patterns on side surfaces of the core patterns, and removing the core patterns, leaving the side wall patterns on the foundation layer, wherein the first pattern includes a first one of the side wall patterns and the second pattern includes a second one of the side wall patterns.

4. The method of fabricating a semiconductor device according to claim 3, wherein:

the closed loop cut is carried out to the second pattern including the second one of the side wall patterns.

5. The method of fabricating a semiconductor device according to claim 3, wherein:

the closed loop cut is carried out to a wiring material filled in grooves having a closed loop shape, the grooves being formed by etching a processed film formed in the foundation layer or formed between the foundation layer and the second pattern by using the second pattern including the side wall patterns as a mask.

6. A method of fabricating a semiconductor device, comprising:

forming a first pattern group including a plurality of first patterns arranged at a predetermined pitch and a second pattern group including a plurality of second patterns arranged at the predetermined pitch, one of the second patterns closest to the first pattern group having parallel parts parallel to the first patterns and nonparallel parts not parallel to the first patterns, wherein:

the parallel parts are at a first distance away from a one of the first patterns which is closest to the second pattern group, the parallel parts and the nonparallel parts are connected to each other at joining points, the nonparallel parts bend from the joining points in a direction away from the first patterns, and the second pattern is formed in a closed loop shape;

forming a resist over the nonparallel parts, a point on the resist, which is closest to the first pattern group, being at a second distance away from the one of the first patterns closest to the second pattern group, the second distance being larger than the first distance; and carrying out a closed loop cut at a region covered by the resist.

7. The method of fabricating a semiconductor device according to claim 6, wherein:

the first patterns have linear parts of a constant line width and are formed in closed loop shapes, and forming the first pattern group and the second pattern group comprises:

forming core patterns on a foundation layer, forming side wall patterns on side surfaces of the core patterns, and removing the core patterns, leaving the side wall patterns on the foundation layer, wherein the first patterns include first ones of the side wall patterns and the second patterns include second ones of the side wall patterns.

8. The method of fabricating a semiconductor device according to claim 7, wherein:

the closed loop cut is carried out to a wiring material filled in grooves having a closed loop shape, the grooves being formed by etching a processed film formed in the foundation layer or formed between the foundation layer and the second pattern by using the second pattern including the side wall patterns as a mask.

9. The method of fabricating a semiconductor device according to claim 6, wherein:

the first pattern group and second pattern group are shifted in opposite directions along a line parallel to a direction in which the first patterns and the second patterns extend.

10. The method of fabricating a semiconductor device according to claim 6, wherein the first pattern group and the second pattern group constitute a lower wiring layer, and the method further comprises:

repeating the steps of claim 6 to form a third pattern group including a plurality of third patterns and a fourth pattern group including a plurality of fourth patterns, the third and fourth pattern groups being formed over the first and the second pattern groups, wherein:

the third pattern group is formed similar to the first pattern group, the fourth pattern group is formed similar to the second pattern group, the third patterns and the fourth patterns extend in a direction perpendicular to the first patterns and the second patterns, and the third pattern group and the fourth pattern group constitute an upper wiring layer.

11. The method of fabricating a semiconductor device according to claim 6, wherein:

after the closed loop cut is carried out, forming contact fringes.

*12. A method of fabricating a semiconductor device including a wiring pattern, comprising:*

*forming an insulating layer above a semiconductor substrate;*

*forming a first pattern part, a second pattern part, and a third pattern part on the insulating layer, wherein:*

*the first pattern part linearly extends in an extension direction on the insulating layer,*

*the second pattern part:*

*is adjacent and parallel to the first pattern part, and*

*is at a first distance away from the first pattern part, and*

*the third pattern part:*

*is connected to the second pattern part continuously, and*

*is adjacent and nonparallel to the first pattern part, and*

*a distance between the first pattern part and the third pattern part gradually increases with a distance from the second pattern part along the extension direction;*

*forming a masking layer above the third pattern part, a point on an edge of the masking layer, which is closest to the first pattern part, being at a second distance away from the first pattern part, the second distance being larger than the first distance; and*

*etching the insulating layer using the first, second, and third pattern parts as a mask.*

*13. The method according to claim 12, wherein the semiconductor device is a semiconductor memory device.*

*14. The method according to claim 12, further comprising:*

*forming, after etching the insulating layer, the wiring pattern in a same layer as the insulating layer.*

*15. The method according to claim 14, wherein the wiring pattern includes at least one of Cu, Al, or W.*

* * * * *